(12) United States Patent
Ku et al.

(10) Patent No.: US 11,930,620 B2
(45) Date of Patent: Mar. 12, 2024

(54) VAPOR CHAMBERS

(71) Applicant: Intel Corporation, Santa Clara, CA (US)

(72) Inventors: Jeff Ku, Taipei (TW); Cora Nien, Changhua County (TW); Gavin Sung, Taichung (TW); Tim Liu, New Taipei (TW); Lance Lin, New Taipei (TW); Wan Yu Liu, New Taipei (TW); Gerry Juan, Taipei (TW); Jason Y. Jiang, Taipei (TW); Justin M. Huttula, Portland, OR (US); Evan Piotr Kuklinski, North Plains, OR (US); Juha Tapani Paavola, Hillsboro, OR (US); Arnab Sen, Bangalore (IN); Hari Shanker Thakur, Bangalore (IN); Prakash Kurma Raju, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 747 days.

(21) Appl. No.: 16/914,294

(22) Filed: Jun. 27, 2020

(65) Prior Publication Data

US 2020/0396864 A1    Dec. 17, 2020

(51) Int. Cl.
*G06F 1/20* (2006.01)
*H01L 23/427* (2006.01)
*H05K 7/20* (2006.01)

(52) U.S. Cl.
CPC ......... *H05K 7/20309* (2013.01); *G06F 1/203* (2013.01); *H01L 23/427* (2013.01); *H05K 7/20136* (2013.01); *H05K 7/20336* (2013.01)

(58) Field of Classification Search
CPC .......... H05K 7/20154; H05K 7/20309; H05K 7/20336; G06F 1/203; H01L 23/427
See application file for complete search history.

(56) References Cited

U.S. PATENT DOCUMENTS

| | | | | |
|---|---|---|---|---|
| 5,937,936 | A | * 8/1999 | Furukawa | ........... H01L 23/3672 174/15.2 |
| 6,164,368 | A | * 12/2000 | Furukawa | ........... F28D 15/0233 361/679.09 |
| 6,241,007 | B1 | * 6/2001 | Kitahara | ................. G06F 1/203 361/689 |
| 6,454,362 | B1 | * 9/2002 | Katsui | ..................... G06F 1/203 301/117 |

(Continued)

FOREIGN PATENT DOCUMENTS

| | | | | |
|---|---|---|---|---|
| JP | 2004015024 A | * | 1/2004 | ......... F28D 15/0233 |
| JP | 2022059833 A | * | 4/2022 | |
| TW | M628952 U | * | 7/2022 | |

*Primary Examiner* — Robert J Hoffberg
(74) *Attorney, Agent, or Firm* — Patent Capital Group

(57) ABSTRACT

There is disclosed in one example a heat dissipator for an electronic apparatus, including: a planar vapor chamber having a substantially rectangular form factor, wherein a second dimension $d_2$ of the rectangular form factor is at least approximately twice a first dimension $d_1$ of the rectangular form factor; a first fan and second fan; and a first heat pipe and second heat pipe discrete from the planar vapor chamber and disposed along first and second $d_1$ edges of the planar vapor chamber, further disposed to conduct heat from the first and second $d_1$ edges to the first and second fan respectively.

11 Claims, 31 Drawing Sheets

(56) References Cited

U.S. PATENT DOCUMENTS

| | | | |
|---|---|---|---|
| 6,752,201 B2* | 6/2004 | Cipolla | G06F 1/203 |
| | | | 257/E23.099 |
| 6,804,115 B2* | 10/2004 | Lai | G06F 1/203 |
| | | | 165/104.34 |
| 6,957,692 B1* | 10/2005 | Win-Haw | F28D 15/0233 |
| | | | 174/15.2 |
| 7,312,985 B2* | 12/2007 | Lee | G06F 1/203 |
| | | | 361/679.48 |
| 8,482,916 B2* | 7/2013 | Wang | G06F 1/203 |
| | | | 361/679.48 |
| 8,831,261 B2* | 9/2014 | Casebolt | G06F 1/1688 |
| | | | 381/306 |
| 8,964,383 B2* | 2/2015 | Degner | G06F 1/203 |
| | | | 361/679.48 |
| 10,423,200 B1* | 9/2019 | North | G06F 1/1616 |
| 10,747,277 B2* | 8/2020 | Ku | H05K 7/20145 |
| 10,831,247 B2* | 11/2020 | Uchino | F28F 3/025 |
| 10,948,240 B2* | 3/2021 | Hsieh | F28F 21/086 |
| 11,262,821 B1* | 3/2022 | North | G06F 1/3296 |
| 11,262,822 B1* | 3/2022 | North | H05K 7/20409 |
| 11,320,876 B1* | 5/2022 | North | G06F 1/166 |
| 11,324,143 B2* | 5/2022 | Stefanoski | H05K 7/20509 |
| 11,324,144 B2* | 5/2022 | Stefanoski | G05D 1/021 |
| 11,547,017 B2* | 1/2023 | Uchino | H05K 7/2039 |
| 11,737,244 B2* | 8/2023 | Stefanoski | H05K 7/20872 |
| | | | 361/704 |
| 2004/0201958 A1* | 10/2004 | Lev | H01L 23/467 |
| | | | 361/679.48 |
| 2015/0060023 A1* | 3/2015 | Herring | F28D 15/0266 |
| | | | 29/890.032 |
| 2018/0187978 A1* | 7/2018 | Herring | H01L 23/427 |
| 2020/0132391 A1 | 4/2020 | Paavola et al. | |
| 2022/0217870 A1* | 7/2022 | Columbus | H05K 7/1092 |
| 2022/0400582 A1* | 12/2022 | Lin | H05K 7/20336 |
| 2023/0030628 A1* | 2/2023 | Chen | G06F 1/203 |
| 2023/0069684 A1* | 3/2023 | Kitamura | G06F 1/203 |
| 2023/0079287 A1* | 3/2023 | Kitamura | G06F 1/206 |
| | | | 361/679.09 |
| 2023/0109587 A1* | 4/2023 | Lee | H01Q 1/38 |
| | | | 343/702 |
| 2023/0124239 A1* | 4/2023 | Kitamura | H05K 7/20154 |
| | | | 361/689 |
| 2023/0189471 A1* | 6/2023 | Hashiba | H05K 7/20154 |
| | | | 361/690 |
| 2023/0189472 A1* | 6/2023 | Wang | H05K 7/20445 |
| | | | 361/695 |
| 2023/0200013 A1* | 6/2023 | Sano | H05K 7/20154 |
| | | | 361/689 |
| 2023/0200014 A1* | 6/2023 | Wang | H05K 7/20336 |
| | | | 361/700 |
| 2023/0337406 A1* | 10/2023 | Bawa | H05K 7/2099 |
| 2023/0354553 A1* | 11/2023 | Ohyama | H05K 7/20336 |

* cited by examiner

VAPOR CHAMBERS

FIELD OF THE SPECIFICATION

This disclosure relates in general to the field of thermal dissipation, and more particularly, though not exclusively, to a system and method for providing improved vapor chambers.

BACKGROUND

Modern computing systems, especially those with very small feature sizes, draw substantial power and generate large amounts of heat. Because heat accumulation can damage electronic components, heat dissipation is an important concern in system design.

BRIEF DESCRIPTION OF THE DRAWINGS

The present disclosure is best understood from the following detailed description when read with the accompanying FIGURES. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

EMBODIMENTS OF THE DISCLOSURE

Figure 1:
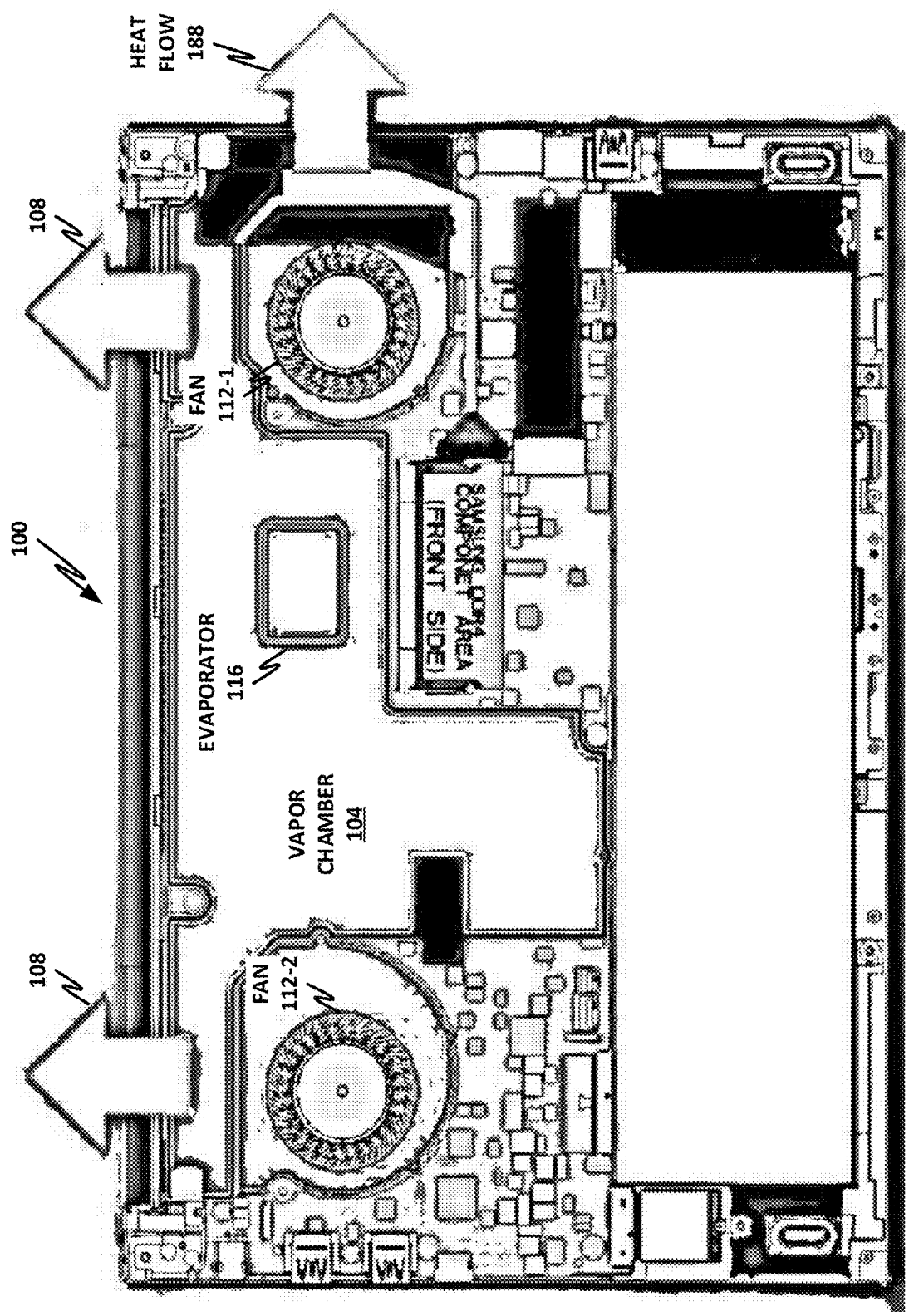
FIG. 1 is a block diagram illustration of internal components of a portable computing system, such as a laptop computer.

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed. Different embodiments may have different advantages, and no particular advantage is necessarily required of any embodiment.

In large desktop systems, where room is abundant, heat dissipation may be accomplished via a simple heat sink and fan atop the processor and graphics processing unit (GPU). This may be sufficient to carry away excess heat and protect the system.

But in smaller portable systems, such as laptop computers and tablet computers, "z-space" (space along the "z-axis," or in other words device thickness) is usually at a premium. When a user first picks up a device, almost the first thing she will notice is its size and weight. So system designers are under pressure to make thinner, lighter devices. Such light, thin devices require more sophisticated and integrated heat solutions.

Vapor chambers may form part of a sophisticated and integrated heat dissipation solution. A vapor chamber has a (usually) conductive outer casing, such as of copper. The vapor chamber includes a hermetically sealed cavity (the chamber), which may be evacuated of air during manufacture, thus forming a vacuum chamber. There is disposed within the chamber an evaporative fluid, such as deionized water or some other fluid, which may be selected for non-corrosivity and high specific heat. The chamber may also include columns that provide structural support and help to ensure that the chamber does not collapse easily.

A portion of the vapor chamber may be placed into contact or near-contact with a heat generating element such as a processor, GPU, or similar. This portion of the vapor chamber may be referred to as the "hot plate," though it need not be a separate or discrete plate. This section may also be called the evaporator. A "cold plate" is a portion that is well-removed from the heat plate. This section may also be called the condenser. As the hot plate heats, the outer wall absorbs heat, and transfers it to the evaporative fluid, which efficiently absorbs the heat because of its high specific heat. Once the evaporative fluid reaches its boiling point, it evaporates and spreads across the vacuum chamber, carrying the heat away from the heat plate. The heated vapor reaches one or more "cold plates," which again need not be separate or discrete plates. The cold plates absorb the heat via condensation. The excess heat may be further dissipated, for example by placing fans at or near the condenser, so that excess heat can be expelled from the system. Because evaporation and condensation are heat-intensive activities (particularly for a fluid with a high specific heat like deionized water), they are very effective heat transfer mechanisms.

After the heat condenses at the cold plate, wicking means may be provided to carry the cooled liquid back toward the heat plate, so the cycle can repeat. Various wicking means are known in the art, including by way of illustrative and nonlimiting example, sluices that carry fluid back toward the heat plate gravitationally, capillaries, or metallic wicks, which may include porous metal that collects water and directs it back toward the heat plate.

In general, a substantially planar vapor chamber (e.g., one in which the dimensions of length and width are within approximately half an order of magnitude of one another), heat is dissipated substantially radially away from the heat source, and it is common to dispose the heat source near a geometric center of gravity of the vapor chamber. A special case of a vapor chamber is the heat pipe, in which the length is more than (and sometimes much more than) approximately five times the width. The heat pipe carries heat laterally along the length of the heat pipe, and can be used to distribute heat from one portion of the device to another. In the case of a heat pipe, the heat source may be placed at or near one end of the heat pipe, so that the heat can be carried to the other end.

The present specification provides a number of improvements to vapor chambers. These improvements may be used individually, or in conjunction with one another, to realize improved structural and operational performance in vapor chambers. To simplify this disclosure, the improvements are disclosed as discrete improvements, and each improvement can stand alone. However, this should not be construed to imply that the improvements need to be independent of one another. For example, a vapor chamber and system design can be improved by jointly applying one, two, or more of the improvements disclosed herein. Thus, while the various improvements are presented separately as discrete features, these embodiments may be joined in any combination desired to realize system-level advantages.

In a first feature, vapor chambers can be improved by using them in conjunction with heat pipes. Specifically, vapor chambers are relatively expensive, and because of their cost, large vapor chambers are sometimes limited to "high-end" laptop computers, such as gaming laptops. However, as noted above, planar vapor chambers conduct heat generally radially. Thus, a vapor chamber may experience "cold spots" at its extremities, where heat cannot effectively reach. This issue may be exacerbated if the vapor chamber has a complex geometry, such as one other than a simple rectangle.

However, the efficiency of a vapor chamber can be increased, while its cost can be reduced, by using the vapor chamber in conjunction with well-placed heat pipes. For example, the size of the vapor chamber may be reduced in one dimension, thus reducing its complexity and cost. Heat pipes may be placed at the edges of the reduced-size vapor chamber, with the lateral dimension of the heat pipes running in the direction that the vapor chamber's dimension was reduced. This may enable the planar vapor chamber to better perform its function of dissipating heat radially. When that heat reaches edges, it can be conducted away by the heat pipes. This may provide improved heat dissipation relative to a planar vapor chamber that is larger in the lateral dimension of the heat pipe. Furthermore, the cost of the smaller vapor chamber may be substantially reduced, thus realizing economic advantages, and making it possible to use vapor chambers in less expensive devices that previously would not have warranted a vapor chamber.

In a second feature, which may be used separately or in conjunction with the embodiment just described, a planar vapor chamber may be structurally improved. In some cases, "ultra-thin" vapor chambers may be used to meet aggressive "z-space" requirements. These may be particularly strict in tablets or similar small devices.

To reduce thermal impedance between the heat source and the vapor chamber, mechanical affixing means may be used to keep the hot plate in close contact with the heat source. The affixing means may include, for example, mechanical bolts or other structures to hold the vapor chamber down "tight" against the heat source. However, particularly in ultra-thin vapor chambers, this can cause mechanical stress, which may cause flexing or z-axis displacement of the vapor chamber. Such flexing may create a danger of buckling, or may reduce the efficiency or service life of the vapor chamber.

To help reduce such z-axis displacement, embodiments of the present specification include an internal "starburst" structure for the vapor chamber that helps to structurally stiffen the chamber, prevent collapse, and provide for a low-profile mounting feature.

In a third feature, improvements may be made to the wick of a vapor chamber. These improvements may reduce the pressure loss of vapor in a thin vapor chamber as vapor travels from the evaporator to the condenser, thereby improving its thermal performance. This may be achieved, for example, by selectively removing portions of the wick to reduce pressure loss from the evaporator to the condenser.

The overall efficiency of a vapor chamber is influenced by a number of factors, including the heat gradient between the evaporator and the condenser, and the pressure loss across the vapor chamber. If there is a high heat gradient, then this means that heat is not being spread efficiently across the entire vapor chamber. The pressure loss also influences the ability of the vapor to carry heat away from the evaporator to the condenser. In fact, it has been observed experimentally that there is approximately an inverse cube relationship between pressure loss within the vapor chamber and heat transfer efficiency. Thus, even modest improvements to pressure loss can lead to dramatic improvements in efficiency.

The pressure loss of the vapor chamber is inversely proportional to the available volume of the vapor chamber. Thus, increasing the volume of the vapor chamber reduces the pressure loss.

However, as noted before, in portable computing devices, which are a common application of vapor chambers, z-space may be relatively limited. For example, a 1 mm thick vapor chamber may have a 0.2 mm wick on top and bottom, leaving a 0.2 millimeter gap for vapor to flow, assuming a 0.2 mm wall thickness. However, if either the top or bottom portion of the wick is removed, then the available flow area for the vapor locally increases from 0.2 mm to 0.4 mm. If both the top and the bottom are removed in a particular region, then the available cross-sectional area for vapor flow may be as high as 0.6 mm.

Because the wick may still be needed to carry fluid back from the condenser to the evaporator, it may not be practical to remove the entire wick. However, if a certain percentage of the wick is strategically removed, such as in patches, then the available cross-sectional area of vapor flow can be locally increased, while still providing sufficient wicking to return condensed vapor back to the evaporator. In an illustrative example, approximately 30% or 45% of the wick may be removed to increase the available volume for vapor flow. In a more general case, anywhere between 15% and 70% of the wick may be removed to provide increased vapor flow.

Removal of the wick from these areas increases the vapor flow area inside the vapor chamber without increasing its thickness. Once condensed, the fluid can reach the evaporator through wicks located elsewhere in the vapor chamber. This effectively increases the local thickness, and thus the vapor flow area, of portions of the vapor chamber. Thus, a relatively thinner vapor chamber can provide thermal performance that is equivalent to the performance of a relatively thicker vapor chamber.

The three features illustrated above define three broad categories of improvements to vapor chambers. For convenience, these first, second, and third categories may be referred to as "A," "B," and "C," respectively. Features A, B, and C are described separately below. For example, FIGS. 1-5 relate to feature category A. FIGS. 6-16 relate to feature category B. FIGS. 17-22 relate to feature category C.

These features are described separately below to aid the reader in understanding each feature. However, this is not intended to imply that the features must exist separately from one another. For example, the present specification anticipates, by way of illustrative and nonlimiting example, the following advantages arising from the following combinations:
  a. A—Improved thermal performance in a vapor chamber with reduced size and corresponding reduced cost.
  b. B—Improved planar integrity for vapor chambers, including for thin vapor chambers.
  c. C—Reduced pressure loss in a vapor chamber, resulting in improved performance and efficiency.
  d. A+B—Improved thermal performance and synergistically improved planar integrity in ultra-thin vapor chambers, with reduced size and cost of the vapor chamber.
  e. A+C—Reduced size and reduced pressure loss in a vapor chamber, resulting in synergistically improved thermal performance.
  f. B+C—Improved planar integrity and reduced pressure loss in ultra-thin vapor chambers, resulting in improved planar integrity and synergistically improved thermal performance.
  g. A+B+C—Reduced size with synergistically improved planar integrity, and reduced pressure loss for synergistically improved thermal performance, in ultra-thin vapor chambers.

A system and method for providing improved vapor chambers will now be described with more particular reference to the attached FIGURES. It should be noted that throughout the FIGURES, certain reference numerals may be repeated to indicate that a particular device or block is wholly or substantially consistent across the FIGURES. This is not, however, intended to imply any particular relationship between the various embodiments disclosed. In certain examples, a genus of elements may be referred to by a particular reference numeral ("widget 10"), while individual species or examples of the genus may be referred to by a hyphenated numeral ("first specific widget 10-1" and "second specific widget 10-2").

Certain of the FIGURES below detail example architectures and systems to implement embodiments of the above. In some embodiments, one or more hardware components and/or instructions described above are emulated as detailed below, or implemented as software modules.

FIG. 1 is a block diagram illustration of internal components of a portable computing system 100, such as a laptop computer. In this illustration, portable computing system 100 includes a number of electronic components that provide the functions and features of the portable computing device. These electronic components may generate heat, and in particular, a central processing unit (CPU), system-on-a-chip (SoC), GPU, or other high-power device may produce more heat than most of the rest of the system. Thus, a vapor chamber 104 is provided to draw heat from a heat generating device, such as the CPU or SoC, and to expel the heat from the system.

In this illustration, vapor chamber 104 is a large planar vapor chamber, with an irregular (e.g., nonrectangular) shape. Vapor chamber 104 includes an evaporator 116, which may be placed over a heat source such as the CPU. Evaporator 116 need not be a discrete or separate plate, but rather may simply be the portion of vapor chamber 104 that most nearly contacts the heat source. The condenser of vapor chamber 104 includes the remote areas removed from evaporator 116 where fluid begins to condense as the temperature drops.

Fans 112-1 and 112-2 are placed strategically at selected portions of vapor chamber 104 to provide heat flows 108 that expel heat away from vapor chamber 104. This effectively transfers the heat from evaporator 116 to the condenser portions of vapor chamber 104, where heat is then expelled outside of the overall system.

In many applications, vapor chambers are considered a "premium" thermal solution, particularly for systems that are constrained in their z-axis (i.e., thin systems). As a premium solution, vapor chambers are both highly effective, and relatively more expensive compared to some other thermal solutions. Thus, cost is still an issue in deploying vapor chambers on non-premium laptops. Because size can be a cost-driver for vapor chambers, they are more common on smaller devices such as smart phones and tablet computers.

Embodiments of the present specification reduce the relative cost by minimizing the spatial coverage of vapor chambers, and by extending their effective reach within a system using additional heat pipes. This design approach may result in an expected cost reduction of up to 40%, due to an improved manufacturing yield rate and cost savings on raw material. Advantageously, it may also improve performance of thermal dissipation in areas within systems (such as the corner zones) typically regarded as areas that vapor can't easily reach. This can be solved by adding straightened heat pipes to the edges of vapor chambers. Furthermore, with the linear thermal conducting characteristics of heat pipes, embodiments of this disclosure may improve overall performance while realizing substantially reduced costs over larger and heavier vapor chambers.

Some existing heat solutions use large vapor chambers covering almost 40% of the internal area of some systems. This is illustrated in the example system of FIG. 1.

In an example consumer-end gaming laptop system, the vapor chamber is extended toward the right edge of the internal system base. This allows the system to have an additional fan outlet with better cooling capability.

Both of these configurations may incur costs that exceed a desired target. Another consideration with existing vapor chambers is the "corner dead end" issue. Vapor chambers are generally designed to transfer heat radially, whereas heat pipes transfer heat linearly. Therefore, vapor chambers are best suited for a rectangular geometry. In practice, however, vapor chamber geometry needs to be aligned to existing system layouts. Thus, the current designs may be inadequate for efficient heat transference.

For example, in FIG. 1 a temperature delta may be produced at the bottom-right corner of the vapor chamber, which means that heat cannot transfer to this area due to the geometry of the system base. An additional graphite spreader could be added to solve this issue, but would lead to increased cost.

The present disclosure describes an edge-to-edge vapor chamber design for high-performance laptops with fan outlets on the side edges. This design includes straight heat pipes placed perpendicular to the motherboard without bends or steps, that are mounted to the side edges of the vapor chamber to maximize the performance of these heat pipes. By using this approach, the size of the vapor chamber and the length of the heat pipes can be minimized without tradeoffs in performance.

Advantages of the disclosed embodiments include:
1. Reduced vapor chamber cost by way of savings in raw material and weight reduction.
2. Easier manufacturing, which improves the yield rate and reduces cost.
3. Improved performance, lower skin temperature, and better acoustics.

Figure 2:
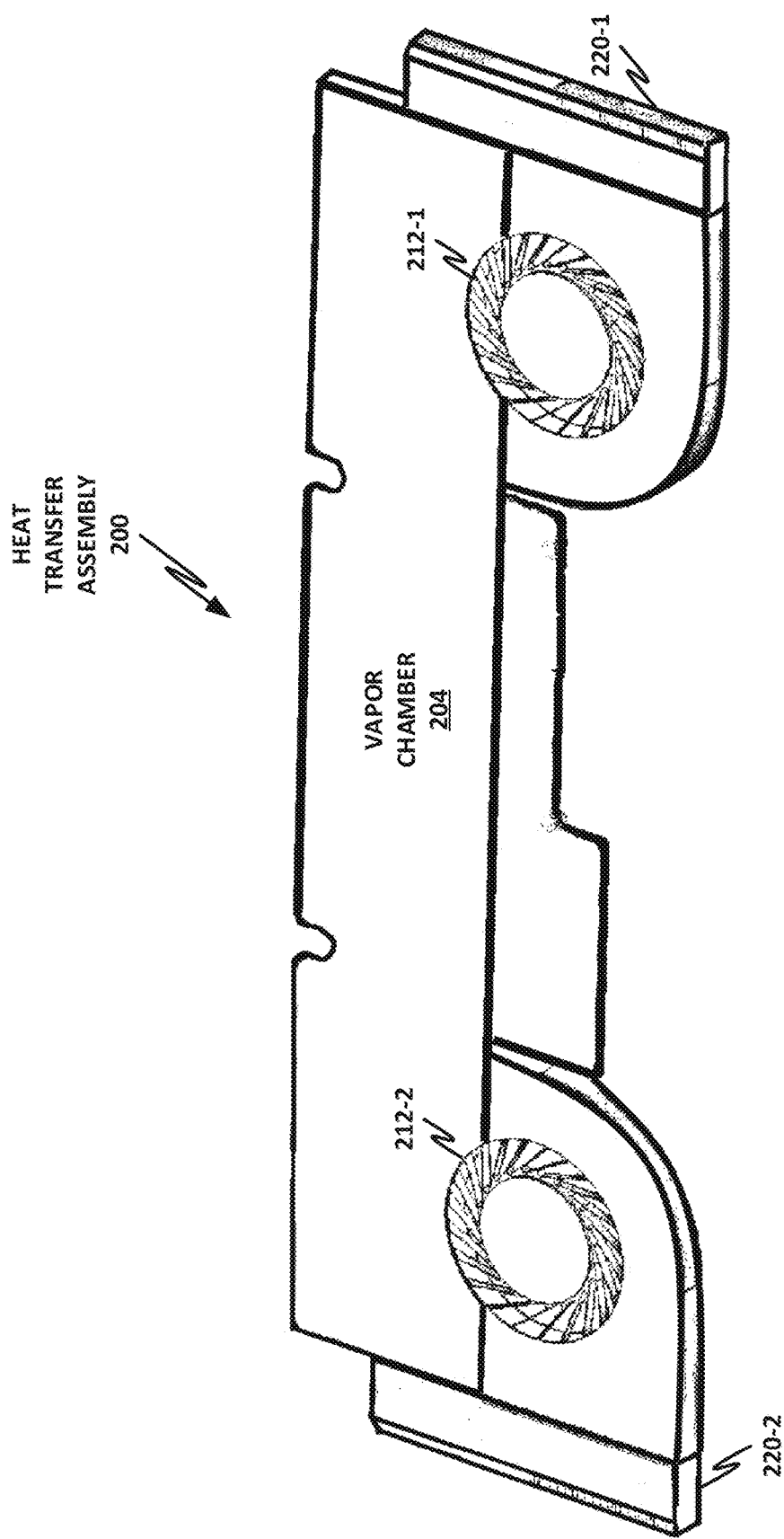
FIG. 2 is an illustration of a heat transfer assembly that may be used in place of, or in conjunction with, the assembly of FIG. 1.

FIG. 2 is an illustration of a heat transfer assembly 200 that may be used in place of, or in conjunction with, the assembly of FIG. 1.

In this example, heat transfer assembly 200 includes a planar vapor chamber 204 that in this case is substantially rectangular. This vapor chamber may still be considered a planar vapor chamber because, for example, the length is not more than approximately five times the width. This is a non-precise definition that divides a vapor chamber from a heat pipe, but not in this case. Heat transfer assembly 200 also includes fans 212-1 and 212-2, again strategically placed to expel heat away from vapor chamber 204. At the shorter ends of vapor chamber 204 are two heat pipes 220-1 and 220-2. Heat pipes 220 are special cases of a vapor chamber. Specifically, heat pipes 220 have a long dimension that is approximately five times or more greater than their shorter dimension.

A truly planar vapor chamber, such as one wherein the length and width are approximately equal, radiates heat radially, so that the heat spreads substantially in every direction. Because vapor chamber 204 in this illustration is not close to a perfect plane, it may experience a somewhat hybrid heat spread. Heat spreads radially out from an evaporator region that may be located, for example, at approximately the geometric center of mass of vapor chamber 204. But because vapor chamber 204 is longer than it is wide, it also experiences some lateral transfer along its long dimension. This carries heat out to the extreme edges of vapor chamber 204, and because heat pipes 220 are in conductive contact with vapor chamber 204, heat is transferred into heat pipes 220. Heat pipes 220 can then efficiently carry heat to fans 212.

In this illustration, it should be noted that heat pipes 220 are sealed off from vapor chamber 204. Thus, there are no vapor chambers with complex geometry in this illustration, but rather they are simply rectangles. This configuration realizes advantages over the heat transfer system of FIG. 1, in that vapor chamber 204 is smaller than vapor chamber 104 of FIG. 1, and thus less expensive to manufacture. Furthermore, heat pipes 220 in conjunction with vapor chamber 204 transfer heat more effectively than a single large vapor chamber with complex geometry. Thus, heat transfer assembly 200 of FIG. 2 is both less expensive and more effective than the complex geometry vapor chamber of FIG. 1.

Figure 3:
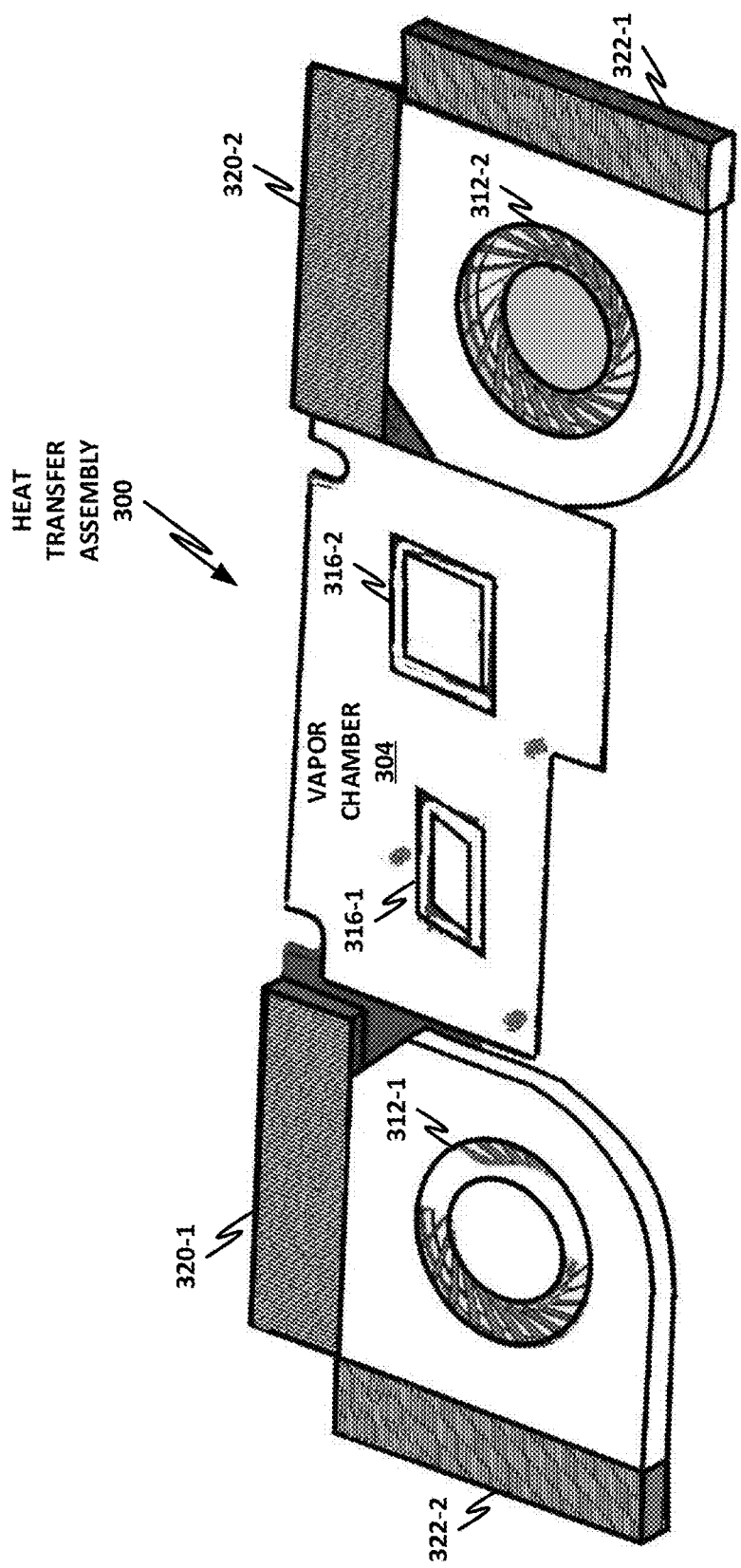
FIG. 3 is a perspective view illustration of an alternative heat transfer assembly.

FIG. 3 is a perspective view illustration of an alternative heat transfer assembly 300.

Heat transfer assembly 300 is somewhat different from heat transfer assembly 200. In this case, heat transfer assembly 300 includes a vapor chamber 304 with two "hot plates," or evaporators, 316-1 and 316-2. As illustrated, vapor chamber 304 is closer to a square, with the length and width dimensions being more approximately equal to one another. In this case, lengthwise heat pipes 320-1 and 320-2 carry heat away from vapor chamber 304. Widthwise heat pipes 322-1 and 322-2 then carry heat down and toward fans 312-1 and 312-2.

As noted above, heat pipes provide a more linear or lateral heat displacement, whereas planar vapor chambers experience more radial heat transfer. Thus, heat pipes 320 and 322 may be used to direct heat to specific regions, away from the disclosed heat sources.

Figure 4:
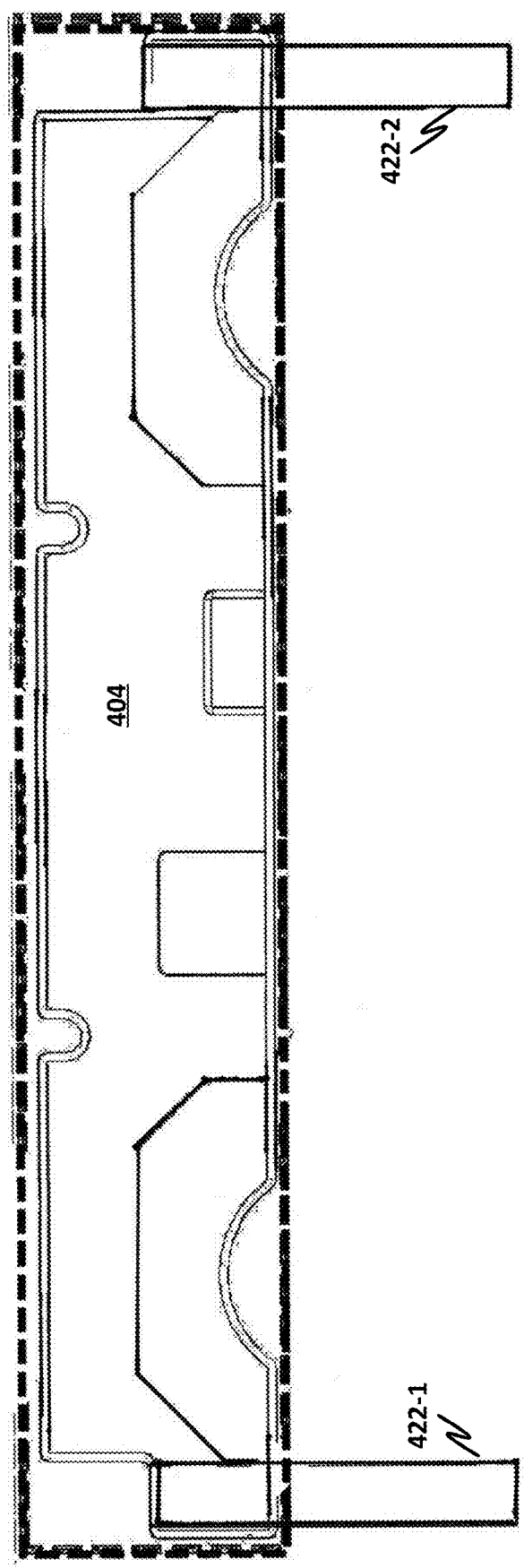
FIG. 4 is an alternative view illustration of a vapor chamber.

FIG. 4 is an alternative top view illustration of a vapor chamber 404, with heat pipes 422-1 and 422-2. FIG. 4 illustrates how the effective vapor zone is distributed, and how the heat pipes are connected to the vapor chamber. The vapor chamber is connected to the heat pipes only from the side edges of the vapor chamber. In simulation cases, it has been found that this is an advantageous placement for the heat pipes. While extending the vapor chamber toward the bottom edges of the side heat exchanger produces good temperature simulation results, previous models have shown that the vapor inside the vapor chamber may not be able to spread sufficiently due to physical limitations of the internal structure of the vapor chamber. The design of the present disclosure is a balance between cost and performance.

Figure 5:
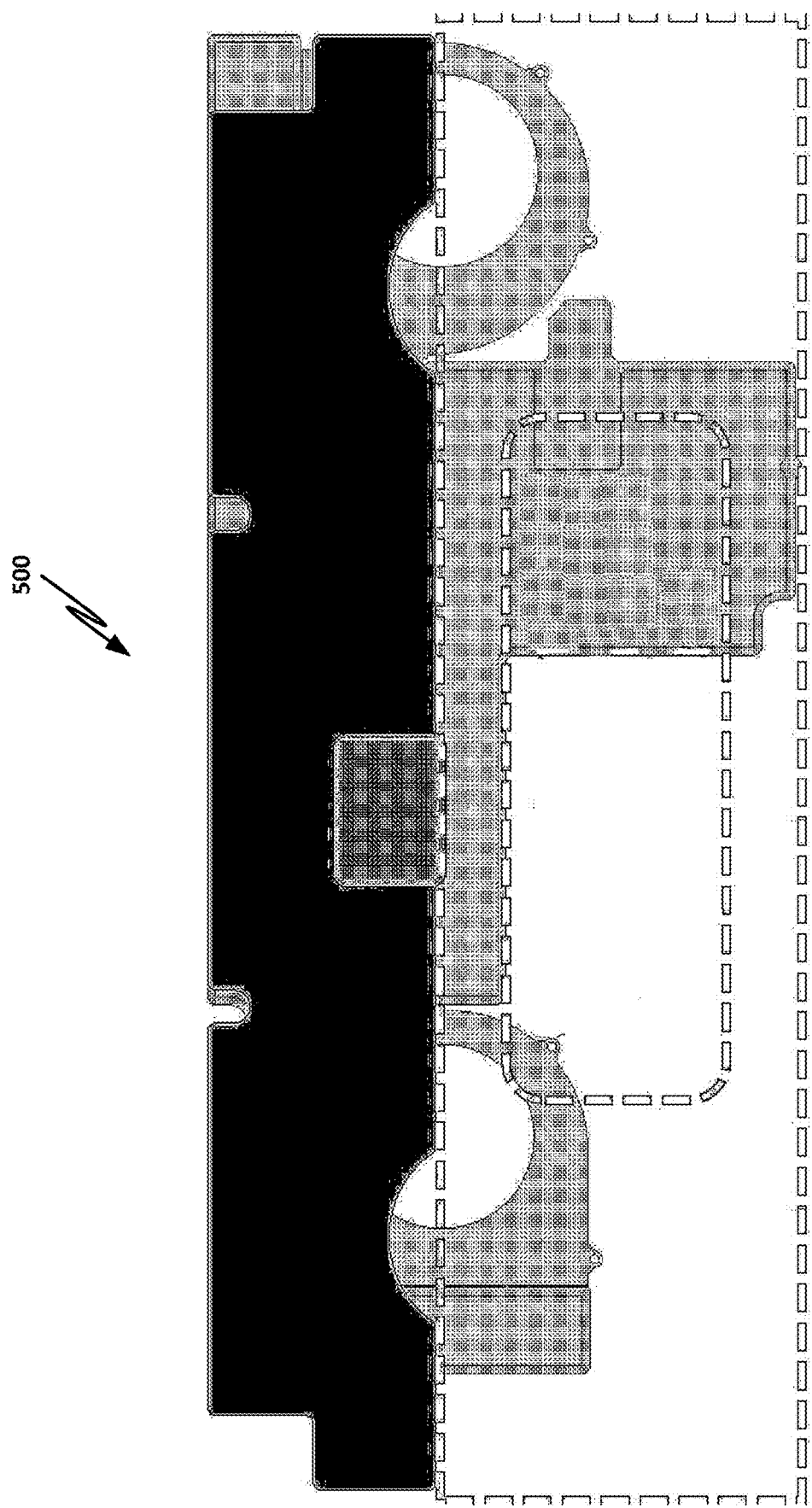
FIG. 5 is a top view illustration of a heat transfer assembly.

FIG. 5 is a top view illustration showing a heat transfer assembly 500 in situ with a portable computing device. FIG. 5 illustrates details of an example vapor chamber assembly design of the present disclosure, and how it may be placed within a system. In the example of FIG. 5, vapor chamber size reduction of up to 60% compared to previous designs is shown, without compromising the heat spreading performance.

Figure 6:
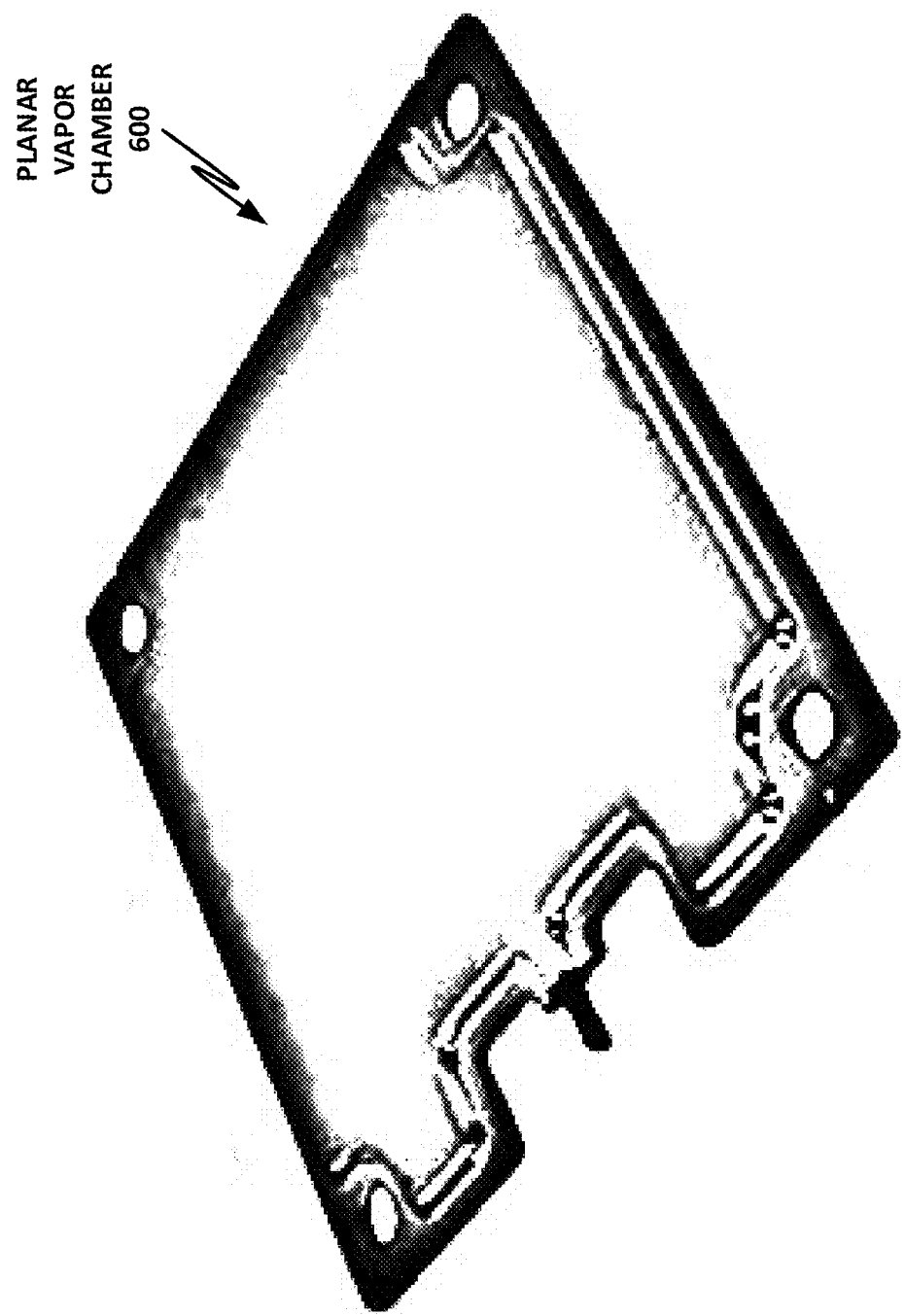
FIG. 6 is a perspective view illustration of a planar vapor chamber.

FIG. 6 is a perspective view illustration of a planar vapor chamber 600, which may be used in conjunction with a "starburst" structural support pattern.

Improving thermal spreading in low-profile, aggressive z-height mobile systems (as defined by the thickness of the motherboard and its components, which can be as little as 3 mm) is often critical to maintaining safe junction temperatures, reducing hot spots on outside skins, and meeting ergonomic temperature limits. Ultra-thin vapor chambers are one option for thermal dissipation in these low-profile systems. As with other thermal spreading and dissipation solutions, such vapor chambers may need to be mechanically coupled to the die or other heat source to operate effectively.

Applying a load to a vapor chamber to reduce thermal impedance to the heat source can create challenges due to the somewhat weak, hollow nature of vapor chambers. With excessive loads, a vapor chamber may collapse or flex excessively, thus reducing the effectiveness of the thermal interface material (TIM) or the vapor chamber itself. This problem is further exacerbated by reducing the overall thickness of the vapor chamber in aggressively thin form factors.

In an embodiment of the present disclosure, an internal structural element is included within the vapor chamber that enables a stiffer assembly capable of supporting the thermal interface load. Such an embodiment may open up a new design space for low-profile mounting methods for thinner and lighter clamshells and 2-in-1 devices.

The internal structural element may be referred to as a "starburst" or "radial" pattern.

Previous solutions include:
Thermal adhesive may be employed to avoid the need to maintain a load on a vapor chamber. However, many low-pressure and low-temperature curing thermal adhesives have relatively poor thermal performance. In general, a reduction in thermal resistance dictates a necessity for the thinnest gap possible between the heat source and the thermal solution. Better thermal performance and thinner bond line adhesives are possible, but may require load applied during the curing process. Some adhesives also require an elevated curing temperature that could compromise the function of a vapor chamber due to thermal expansion of the working fluid within.

Stiffener plates may be soldered or attached to a vapor chamber to provide additional rigidity, yet these also consume z-space, which may be precious in a low-profile system. Additionally, stiffener plates on the condenser side of the chamber may not reduce the risk of vapor chamber collapse on the evaporator side if the die surface being attached to is relatively small and creates local loads on the attached surface. Stiffeners on the evaporator side may need to be placed outside the package area to conserve z-height, and thus share space with other components on the motherboard.

Copper pillars may be added internally to a vapor chamber to help maintain spacing between the evaporator and condenser sides, but may primarily improve compressive load performance versus bending and/or flexural stiffness.

Figure 7:
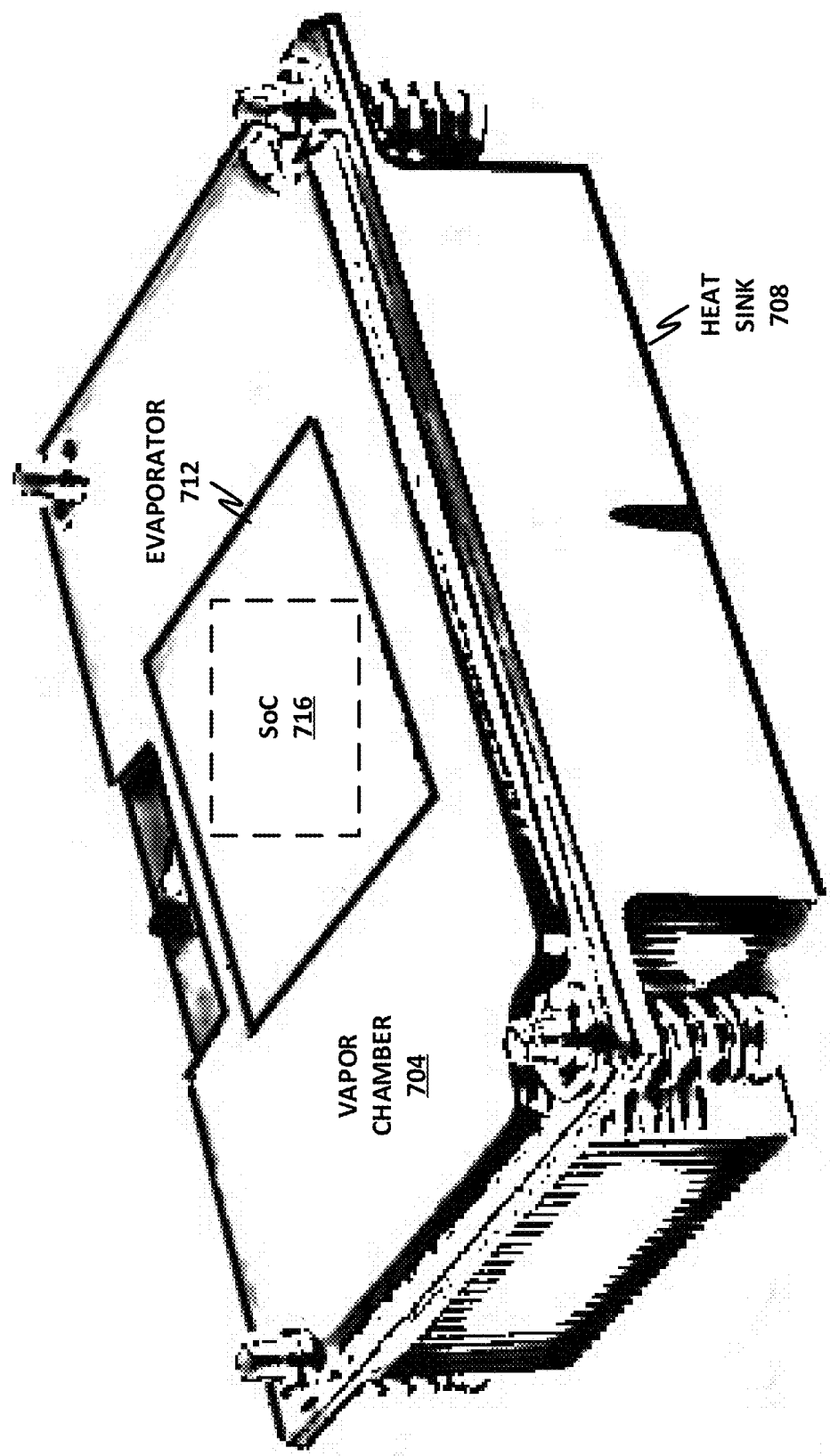
FIG. 7 is a perspective view illustration of a vapor chamber in situ with a heat sink.

FIG. 7 is a perspective view illustration of a vapor chamber 704 in situ with a heat sink 708, with a system-on-a-chip 716 directly or nearly directly thermally coupled to evaporator 712.

Figure 8:
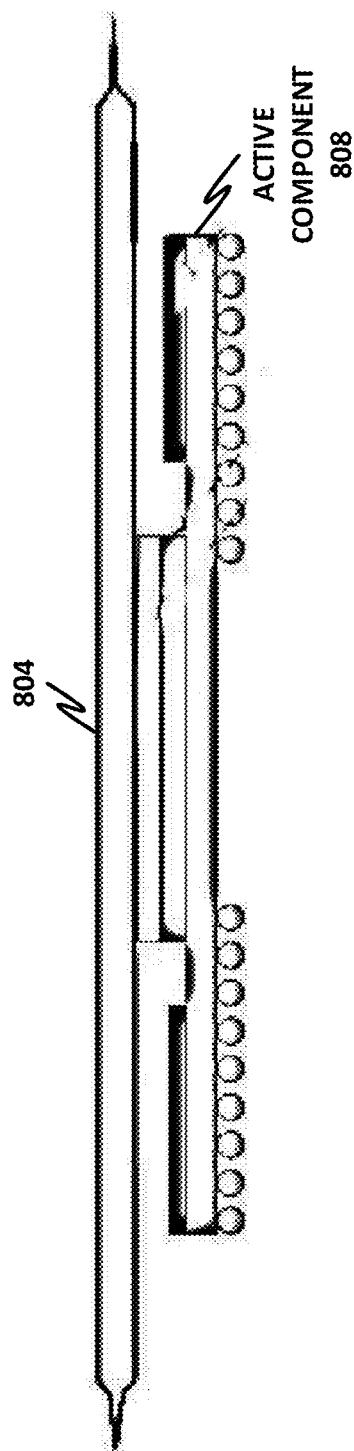
FIG. 8 is a side view in situ illustration of a planar vapor chamber.

FIG. 8 is a side view in situ illustration of a planar vapor chamber 804.

Planar vapor chamber 804 is thermally coupled to an active component 808, which may be soldered, for example, to a motherboard or other circuit board.

Figure 9:
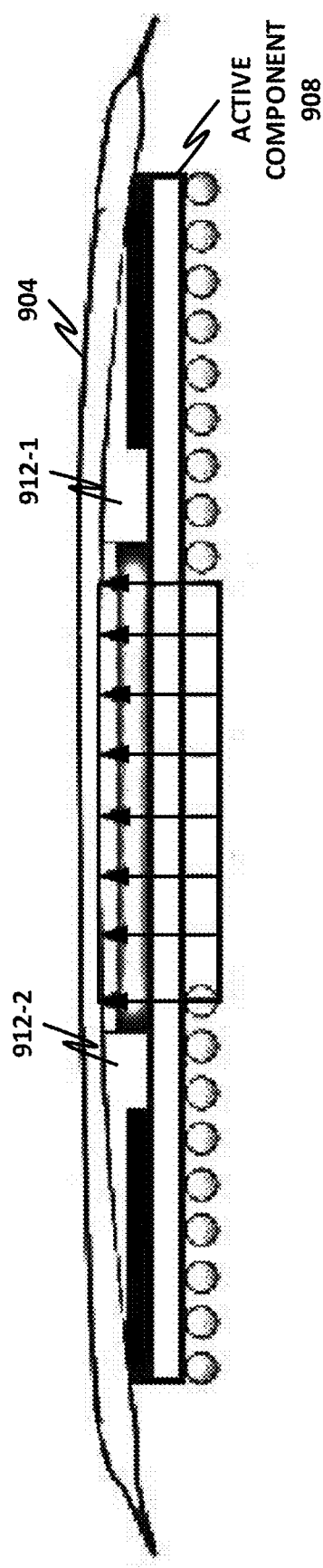
FIG. 9 is a side view illustration of flexing of a vapor chamber.

FIG. 9 is a side view illustration of flexing of a vapor chamber. As shown, vapor chamber 904 mounts to active component 908. Affixing means 912-1 and 912-2, such as screws or bolts, secure vapor chamber 904 to active component 908. This ensures good, close thermal contact, and increases the efficiency of the heat transfer. However, as illustrated, this can result in flexing of vapor chamber 904.

Embodiments of the present disclosure provide an integrated structure within a vapor chamber that structurally acts to both stiffen and prevent collapse of the chamber, and to provide for low-profile mounting features. Disclosed embodiments may also provide advantages for devices with passive cooling, enable higher loads applied to vapor chambers for improved thermal interfaces to the die (with thinner, more consistent bond lines), and mitigate deflection in vapor chambers, reducing the risk of interference with package stiffeners or neighboring components. These advantages may reduce the total z-budget required, as formed pedestals that space vapor chambers away from the die could be shortened or removed. Certain embodiments may also enable lower-profile mounting methods that meet increasingly restrictive z-height goals.

Vapor chambers with multi-artery wicks to enhance fluid transport in high-power applications have been in use for many years. However, such embodiments are sometimes not utilized in mobile products that are driven by skin temperature limits. The artery-like wicks of the present specification expand beyond the heat source to integrate with their respective mounting locations. This interfacing where a vapor chamber attaches to the system dramatically improves stiffness above the package, while facilitating proper loading.

Figure 10:
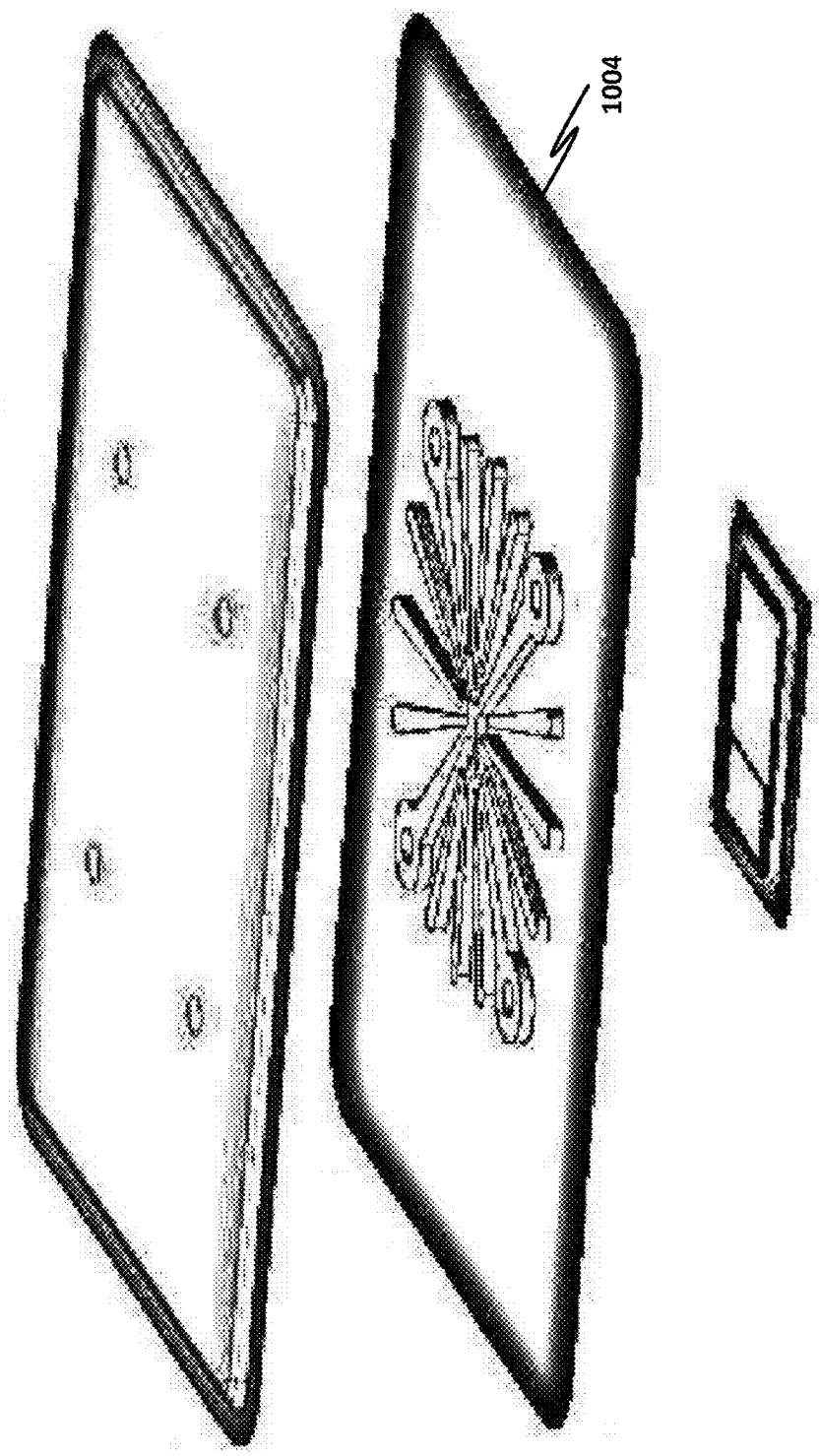
FIG. 10 is a cutaway perspective view illustration of a vapor chamber.

FIG. 10 is a cutaway perspective view illustration of a vapor chamber 1004 employing a starburst structural support pattern.

Figure 11:
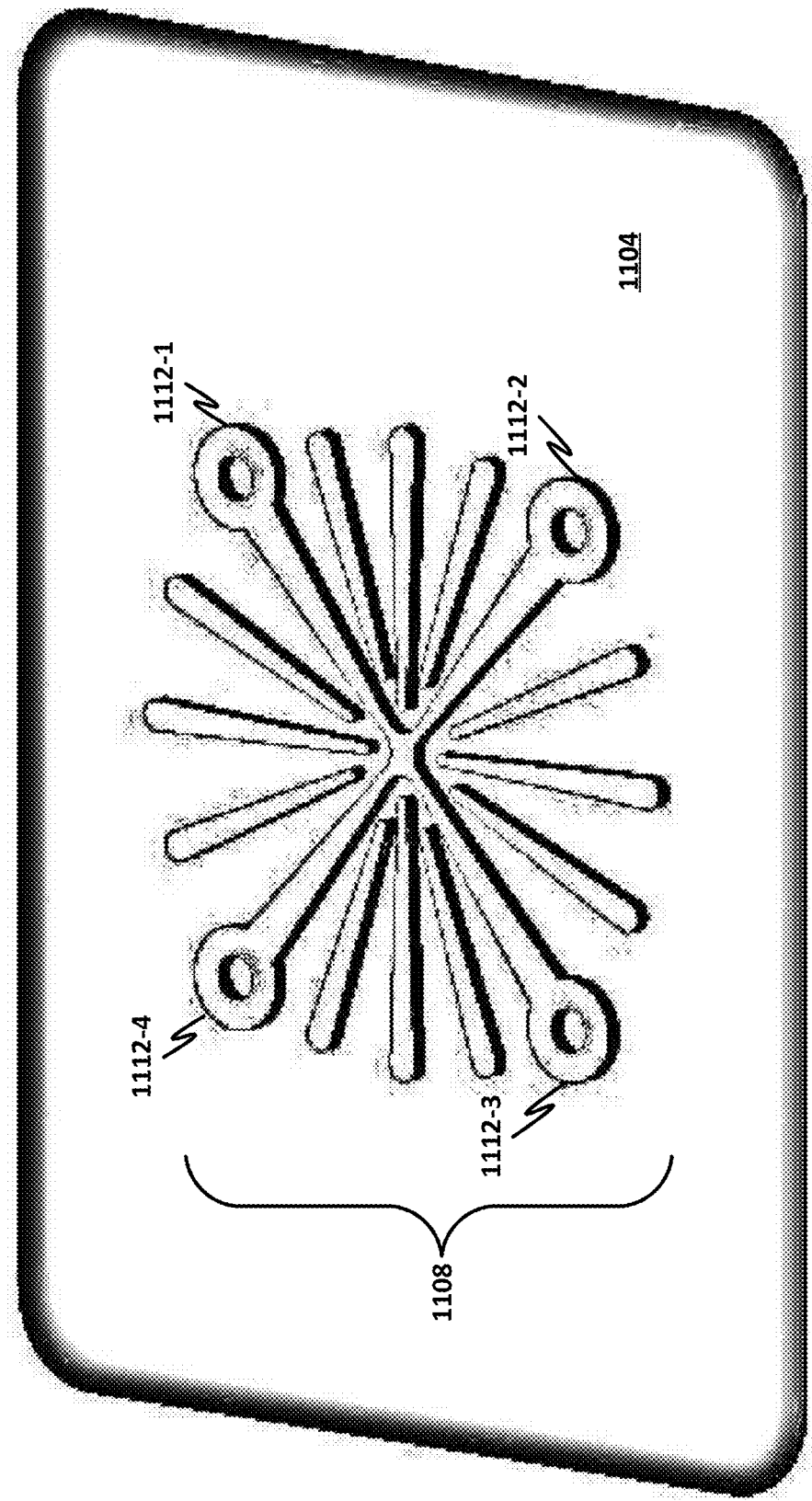
FIG. 11 is a detailed view illustration of a starburst structural support pattern on a vapor chamber.

FIG. 11 is a more detailed view of a starburst structural support pattern on a vapor chamber. In FIG. 11, vapor chamber 1104 includes starburst structural support pattern 1108. Starburst structure 1108 includes mounting points 1112-1, 1112-2, 1112-3, and 1112-4. Mounting points 1112 may provide through-holes where affixing means such as screws or bolts can pass through columns to mount vapor chamber 1104.

Figure 12:
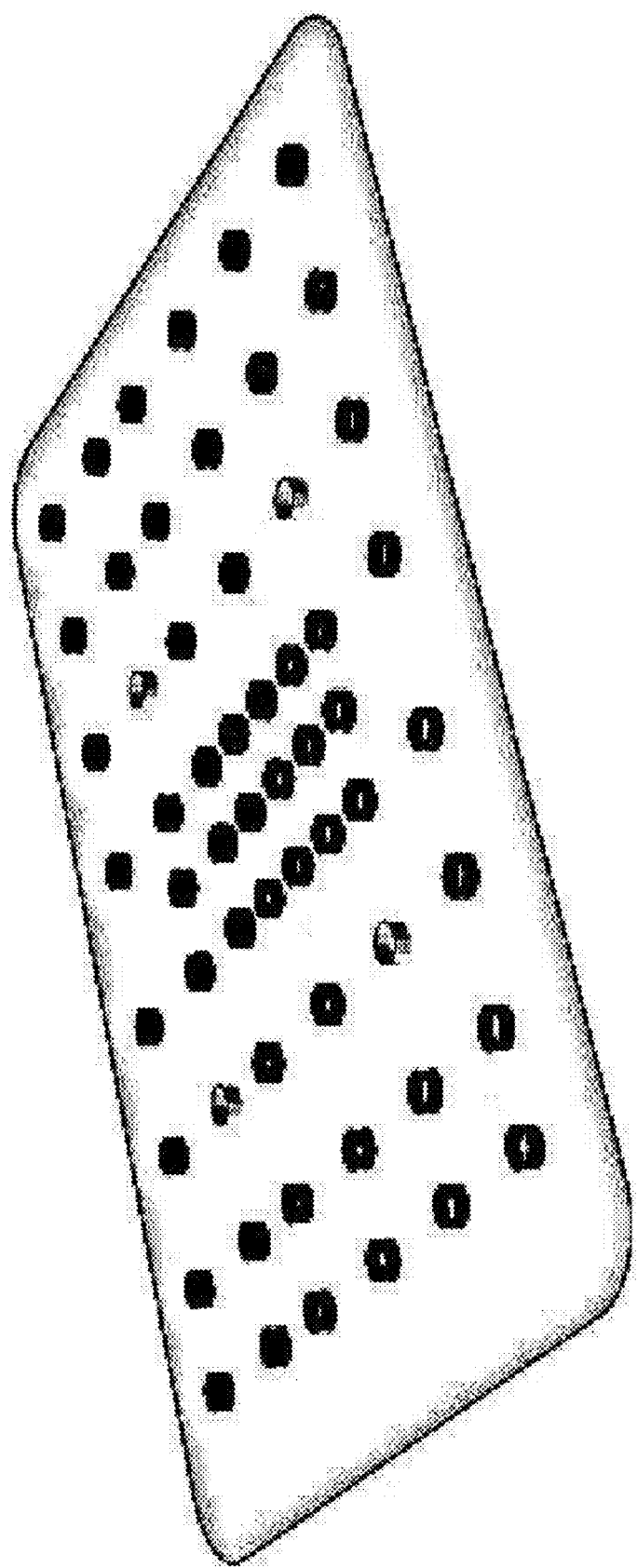
FIG. 12 is a perspective view illustration of support columns within a vapor chamber.

FIG. 12 is a perspective view illustration of support columns within a vapor chamber.

Figure 13:
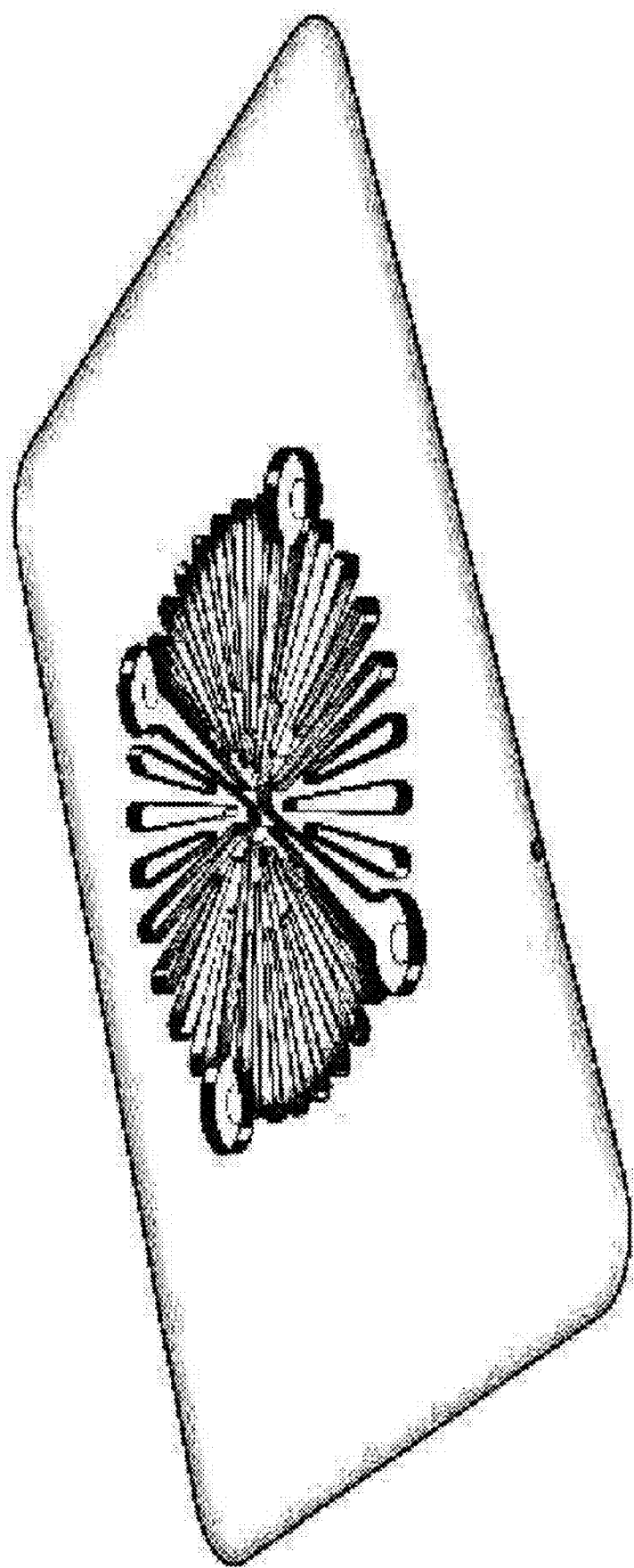
FIG. 13 is a perspective view illustration of a columnar starburst pattern.

FIG. 13 is a perspective view illustration of a columnar starburst pattern.

In some applications, these structures are focused on increasing fluid flow into the "hot zone" or evaporator of the chamber, and not primarily on improving the structural properties of the chamber. Embodiments of the present disclosure introduce a radial or starburst pattern that can be enlarged to encompass the entire package surface and not just the die. Artery size and shape may balance thermal as well as structural performance. Individual ribs may also incorporate features for mounting, such as through-holes or rings around counter-sunk holes, to improve structural integrity along the load path within a vapor chamber.

Modeling with finite element analysis (FEA) has been used to compare a standard copper pillar vapor chamber to embodiments of the present specification. Both the copper pillar vapor chamber and a vapor chamber of the present disclosure employ 200 μm thick walls with 1 mm thick vapor cavities for a total 1.4 mm thick assembly. The chamber assembly may be constrained by the four corner mounting holes (or locations in absence of holes) and a 20 pound-force (lbf) die load may be applied at the lower evaporator surface for modeling purposes. Maximum deflection of the baseline under these conditions has been shown to be four to five times larger in the copper pillar vapor chamber than in the presently disclosed embodiment.

One possible embodiment of a lower-profile mounting system utilizes the internal structure of the disclosed vapor chamber to carry the spring force from the backing plate to the top of the die and through the thermal interface. Because the structure is integrated into the vapor chamber, perhaps as sintered versus solid material, this type of structure may be lighter overall.

Note that the internal structure may need to be refined to balance both the structural and thermal performance, so the actual shape and design of the internal structure may vary from the disclosed examples.

Figure 14:
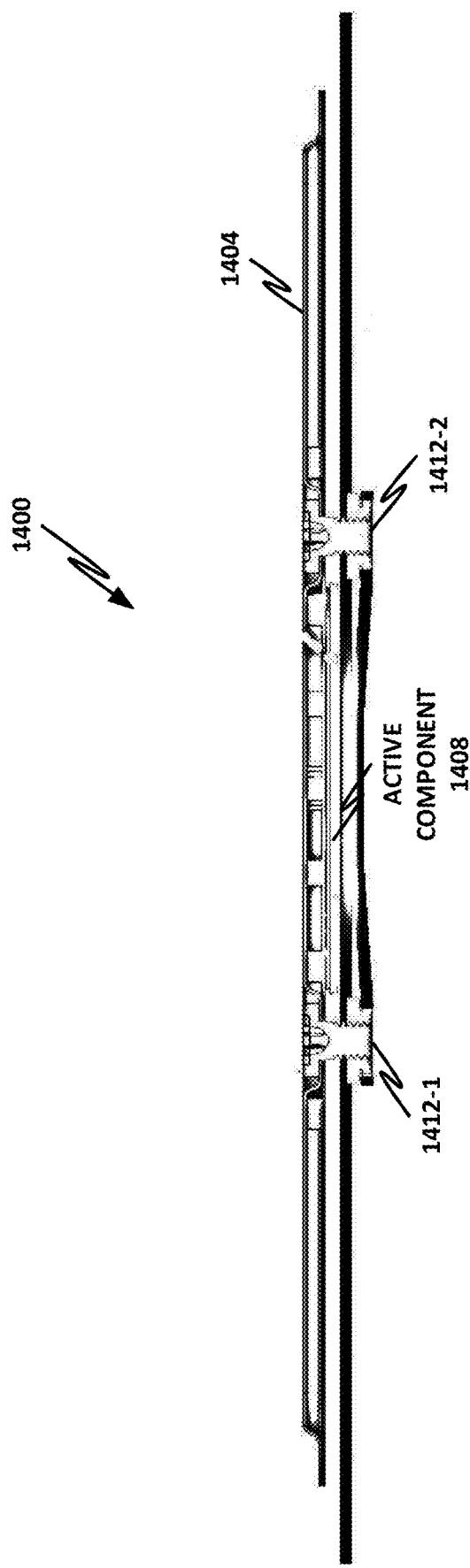
FIG. 14 is a side view in situ illustration of a vapor chamber.

FIG. 14 is a side view in situ illustration 1400 of a vapor chamber 1404. This in situ view illustrates a benefit of the starburst pattern. Specifically, vapor chamber 1404 sits atop active component 1408, and affixing means 1412-1 and 1412-2 hold vapor chamber 1404 in close contact with active component 1408 for good thermal conduction and heat transfer. However, with the starburst structural pattern, there is less flexing of vapor chamber 1404.

Figure 15:
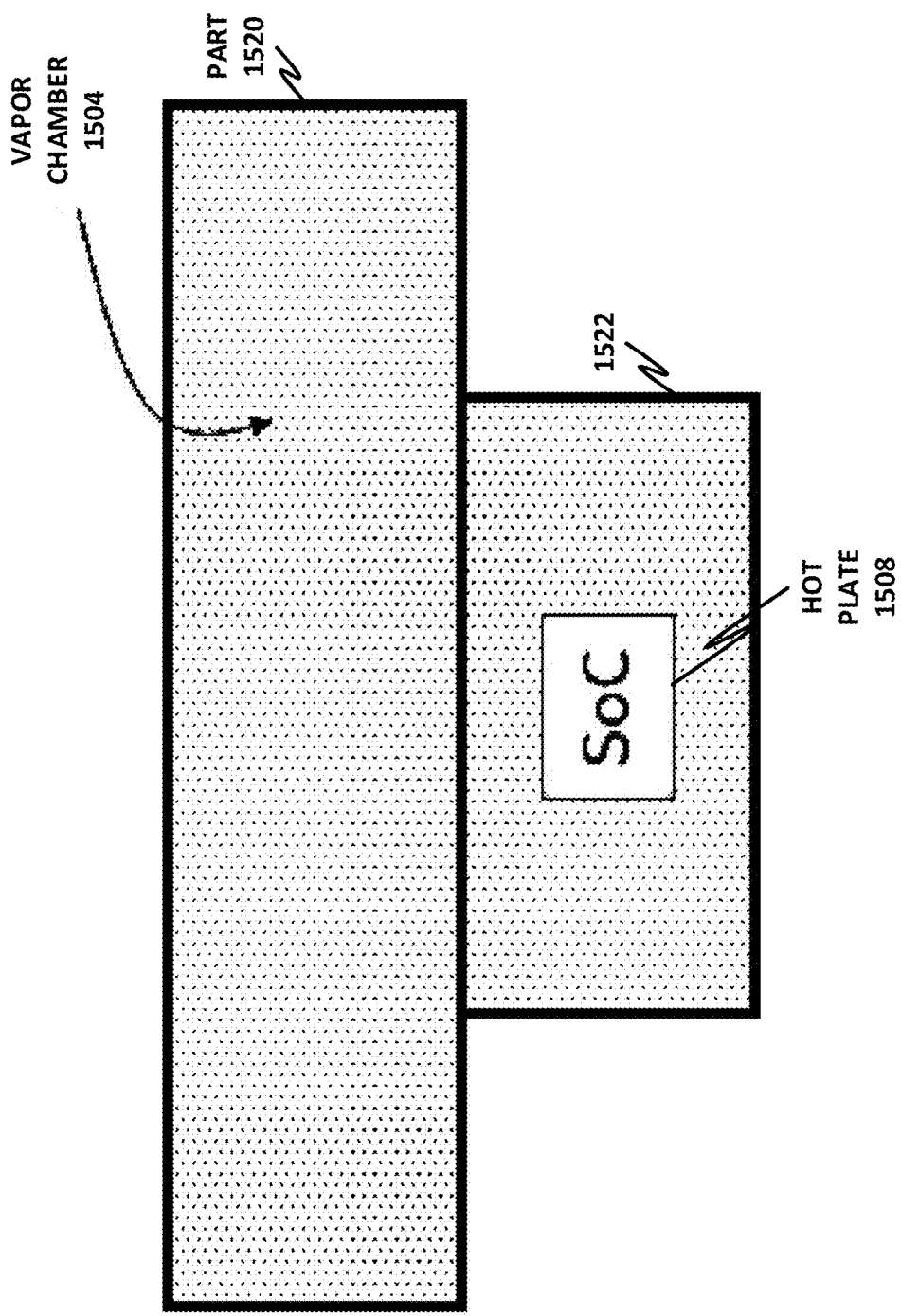
FIG. 15 is a top view illustration of a vapor chamber.

FIG. 15 is a top view illustration of a vapor chamber 1504. Vapor chamber 1504 is a two-part vapor chamber, with the parts labeled simply part 1 1520, and part 2 1522. A hot plate 1508 is located above an active component such as an SoC.

In an additional aspect of the present specification, pressure loss of the vapor in a thin vapor chamber is reduced as it travels from evaporator to condenser, thereby improving its thermal performance. This is achieved by strategically removing the wick from patches to reduce vapor pressure loss from evaporator to condenser. Removal of the wick increases the vapor flow area inside the vapor chamber without increasing the vapor chamber thickness. Once condensed, the liquid reaches the evaporator through wicks located elsewhere in the system base. A similar effect may be achieved in heat pipes through local thickening.

Figure 16:
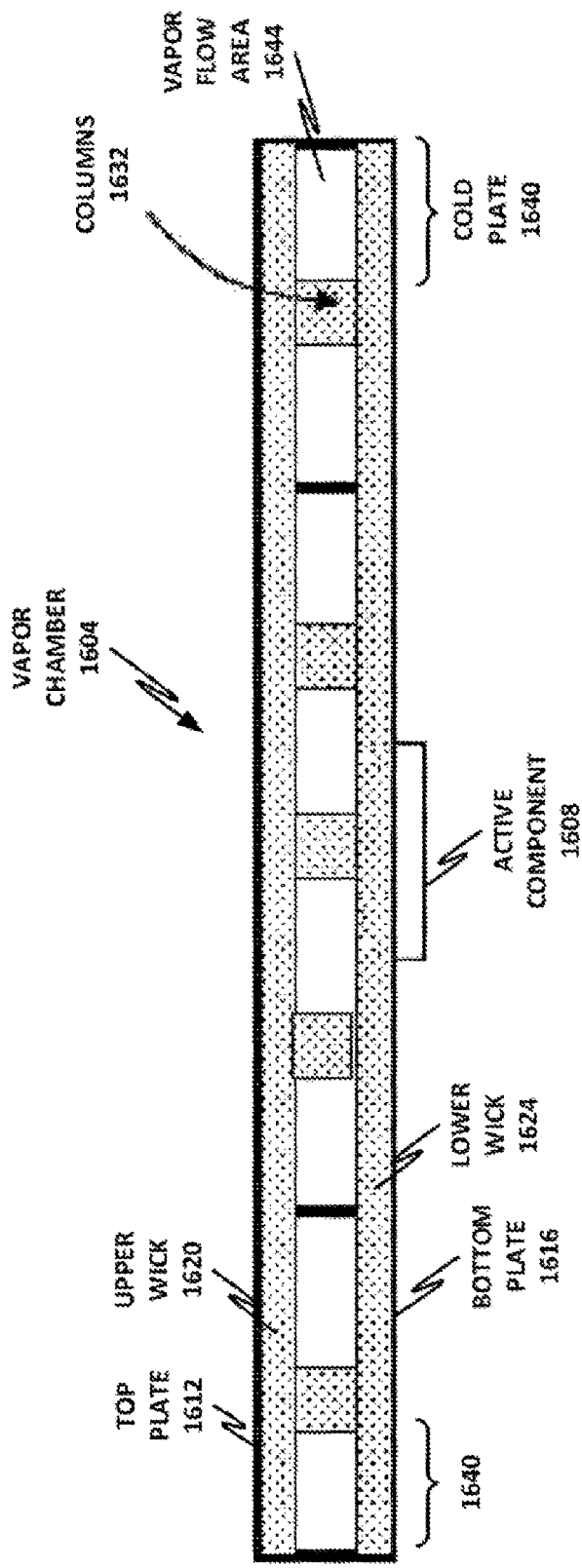
FIG. 16 is a side view illustration of a vapor chamber.

FIG. 16 is a side view illustration of a vapor chamber 1604. In the illustrated side view of vapor chamber 1604, there is visible a top plate 1612 and a bottom plate 1616. An upper wick 1620 is affixed to top plate 1612, and a lower wick 1624 is affixed to bottom plate 1616. An active component 1608 is in close thermal contact with a hot plate of vapor chamber 1604. Columns 1632 help provide structural support to vapor chamber 1604.

By way of illustrative example, vapor chamber 1604 may have an overall thickness of 1 mm. This is provided by way of illustrative and nonlimiting example only, and it should be noted that a vapor chamber may have any suitable thickness for the application.

In the case of a vapor chamber that is 1 mm thick, top plate 1612 and bottom plate 1616 may both be approximately 0.2 mm thick to provide structural integrity to the hermetic enclosure. Upper wick 1620 and lower wick 1624 may both be approximately 0.2 mm thick to provide transfer of fluid from cold plate regions 1640 back to top plate 1612. This leaves an internal vapor flow area 1644 of approximately 0.2 mm. Heat transfer efficiency can be increased by reducing the pressure loss within vapor flow area 1644. However, wicks 1620, 1624 may be necessary to carry fluid from cold plates 1640 back to top plate 1612.

Figure 17:
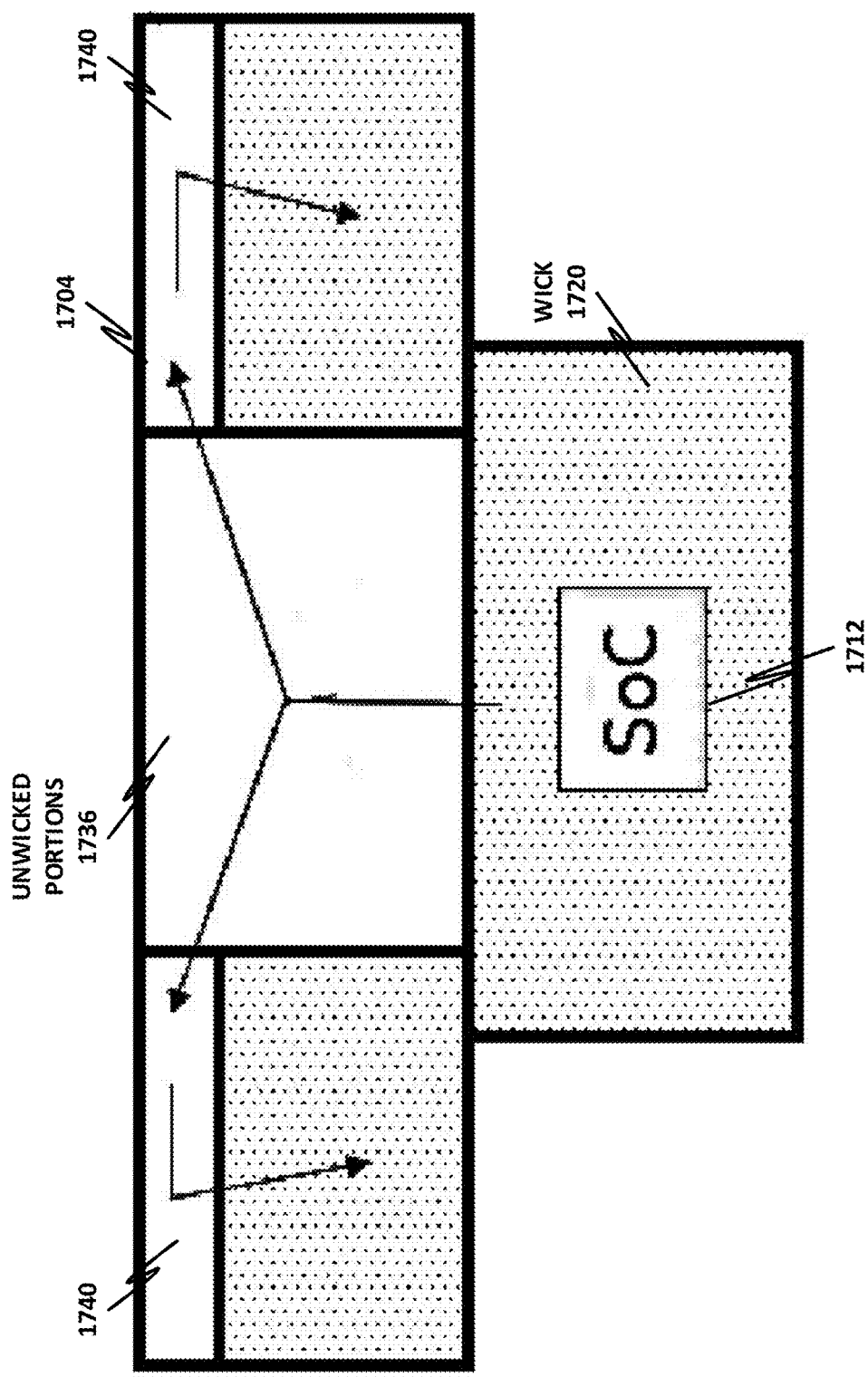
FIG. 17 is a top view illustration of selective removal of portions of a wick.

FIG. 17 is a top view illustration of selective removal of portions of the wick.

In this example, vapor chamber 1704 includes wick 1720, which carries fluid from wicked portions 1740 back to hot plate 1712. However, portions of vapor chamber 1704 do not include a wick 1720. These are labeled as unwicked portions 1736. Vapor flows freely through unwicked portions 1736, but unwicked portions 1736 may be selected to be portions of vapor chamber 1704 where the evaporative fluid generally does not condense, but rather remains in its vaporous state. Fluid condenses at wicked portions 1740, and is then carried by wick 1720 back to hot plate 1712, where it can evaporate again. Because portions of vapor chamber 1704 that do not generally experience condensation are selected for removal of wick, pressure loss across vapor chamber 1704 is reduced, because a greater flow area is provided within unwicked portions 1736. Wicked portions 1740 may include those portions where fluid generally condenses, as well as wicking means that may be required to carry fluid back to hot plate 1712.

Figure 18:
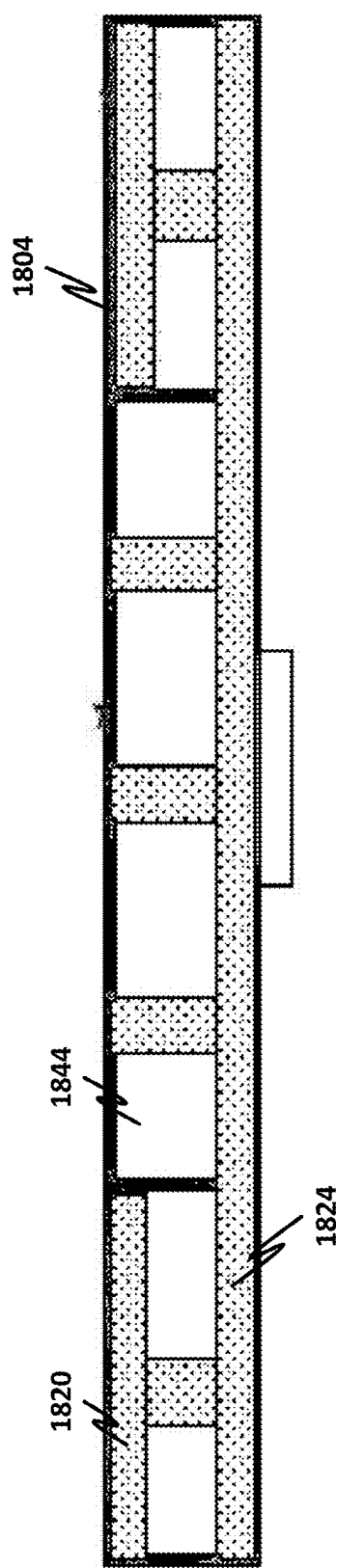
FIG. 18 is a cutaway side view illustration of a vapor chamber.

FIG. 18 is a cutaway side view illustration of a vapor chamber 1804 with selected portions of the wick removed. As can be seen in this illustration, portions of upper wick 1820 have been removed so that, in certain local areas, the thickness of vapor flow area 1844 is substantially increased. For example, using the previous illustrative measurements, the vapor flow area thickness is increased from 0.2 mm to 0.4 mm. This could be further increased by removing portions of lower wick 1824 in those same regions. Alternatively, portions of lower wick 1824 could be removed from different areas.

By effectively increasing the vapor flow area, a thin vapor chamber can be made to provide similar thermal performance as that of a thicker vapor chamber. Alternatively, a thick vapor chamber can be made thinner for similar performance. Embodiments of this specification may achieve improved performance in current systems of average chassis height, or in systems with reduced chassis thickness while retaining similar performance. Performance improvement may also be realized by removing only portions of upper wick 1820. Advantageously, the disclosed embodiments may further reduce vapor chamber cost and weight due to less wick powder usage.

FIGS. 15-16 and 17-18 respectively illustrate benefits of selectively removing portions of the wick to reduce pressure loss. In some existing systems, the wick is present in the entirety of the top and bottom surfaces of the vapor chamber, as illustrated in FIGS. 15 and 16.

In disclosed embodiments, the wick layout is designed in patches, such that the wick is not present continuously throughout the vapor chamber, as illustrated in FIGS. 17 and 18.

Figure 19:
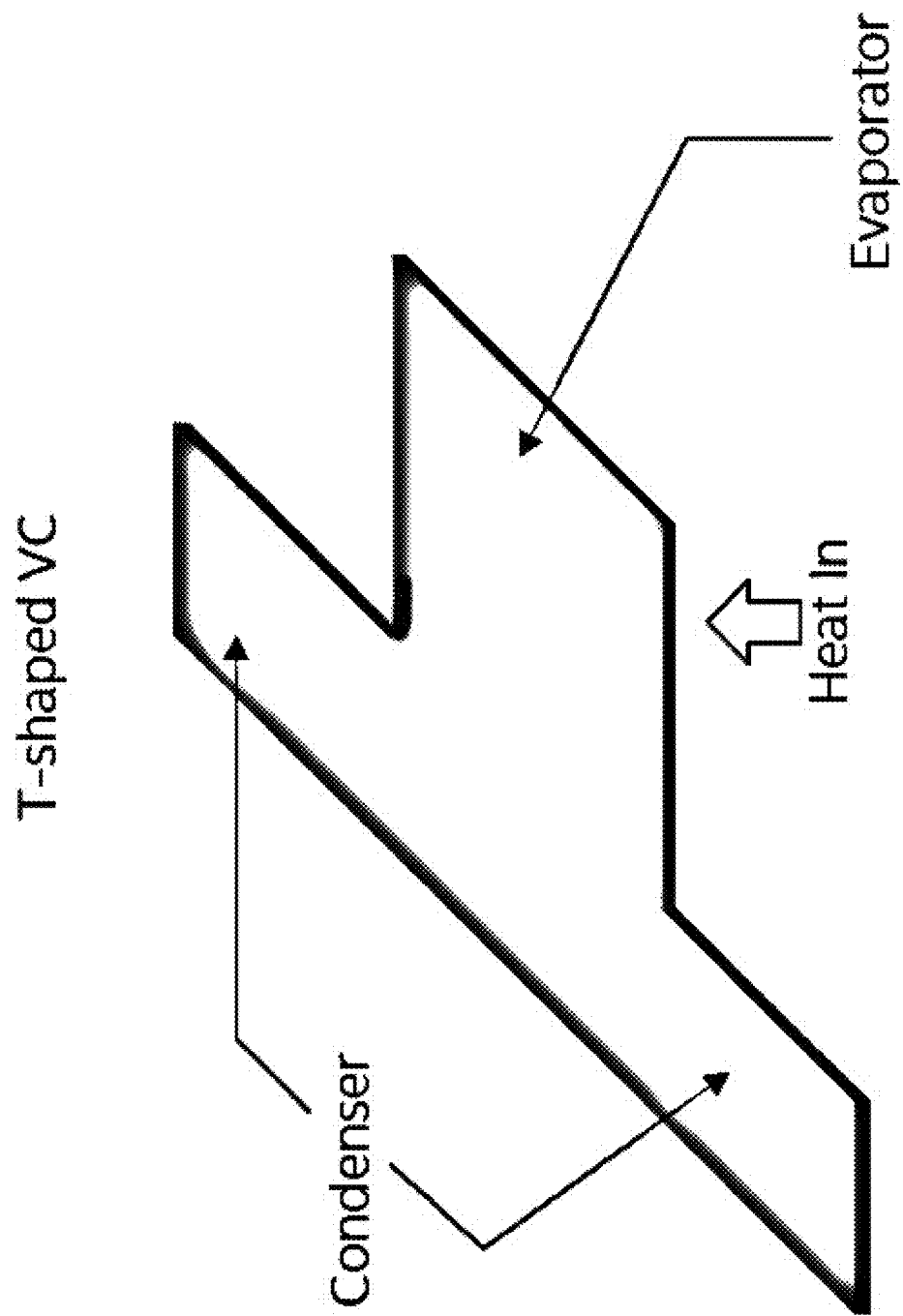
FIG. 19 is a perspective view illustration of heat transfer from an evaporator to a condenser.

FIG. 19 is a perspective view illustration of heat transfer from an evaporator to a condenser.

Strategically, the wick is removed in portions to guide the vapor from the evaporator to the condenser, as illustrated in FIG. 19. The liquid from the condenser reaches the evaporator through the wick present elsewhere in the system base. This ensures that vapor pressure loss is reduced as it travels from the evaporator to the condenser, enabling higher flux handling capacity since vapor reaches the condenser with lesser resistance and lower back pressure development near the evaporator. This enables quicker replenishment of the evaporator with condensed liquid, and hence, delayed dryout.

An illustrative vapor chamber of 1 mm thickness may have 0.2 mm of wick on the top and bottom, leaving a 0.2 mm gap for the vapor to flow (given a wall thickness of 0.2 mm). In the present disclosure, the same 1 mm vapor chamber will have pathways for the vapor as high as 0.4-0.5 mm (since the wick is absent), which is about three times the area available in other vapor chambers.

Figure 20:
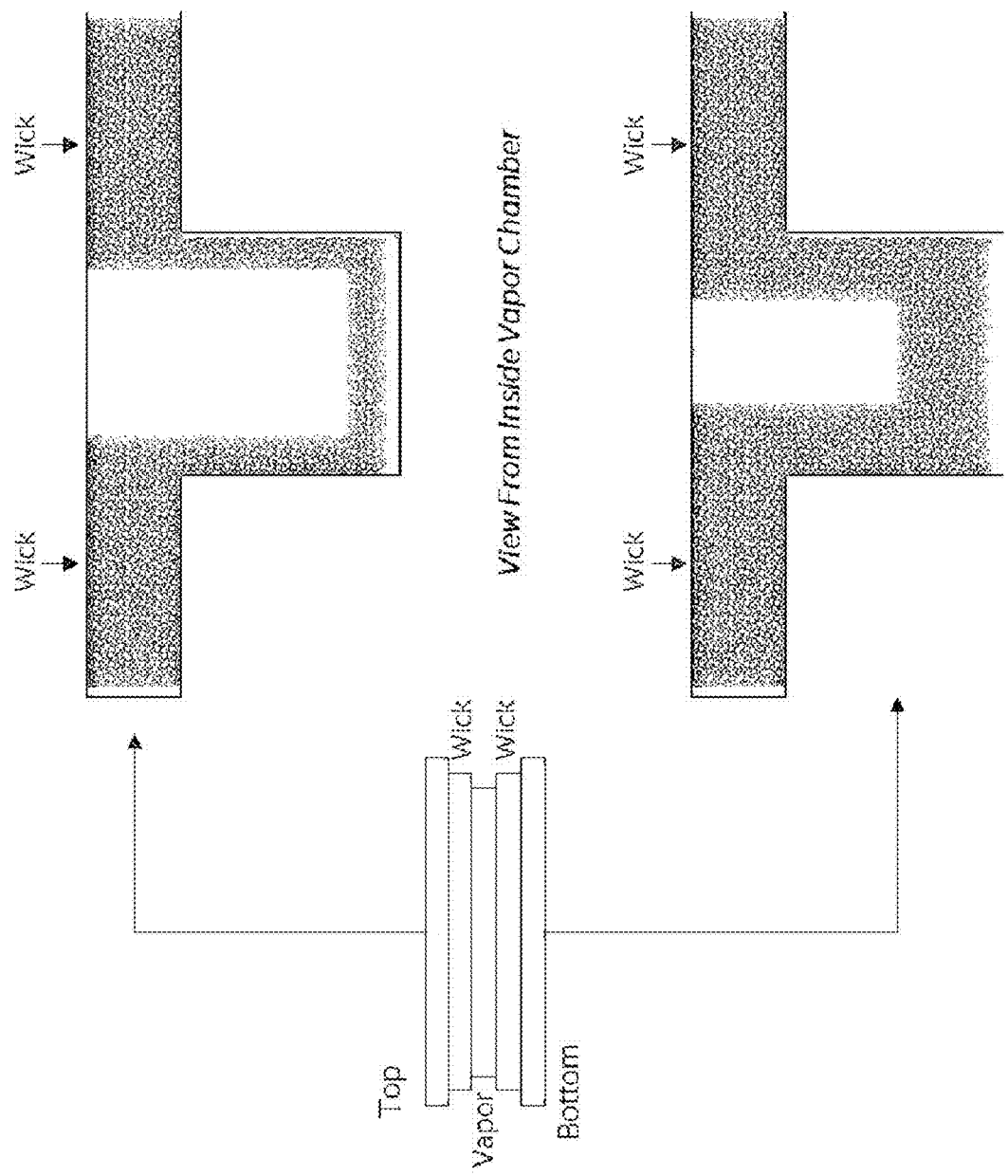
FIG. 20 is a cutaway side view illustration of a vapor chamber with selected portions of the wick removed.

FIG. 20 is a cutaway side view illustration of a vapor chamber with selected portions of the wick removed. FIG. 20 illustrates two example embodiments where varying amounts of wick have been removed. For example, approximately 30% or 45% may be removed, or between 15% and 70%.

Disclosed embodiments benefit from the fact that increasing the flow area reduces the pressure loss in a two-phase heat transport device. Hence, the benefit can be demonstrated by showing the performance improvement in a locally thickened heat pipe. Local thickening in heat pipes results in locally increased flow area.

This benefit may be demonstrated in an example test setup. In one embodiment, the setup may consist of heat pipes without local thickening (i.e., they are uniformly flat with a 1.2 mm thickness). In another embodiment, the heat pipes have been made locally thicker in the highlighted region from 1.2 mm to 1.5 mm. This means that in the highlighted patch, the vapor flow area may increase by 25%. This increase is indicative of the thermocouple location.

The concept of local thickening in heat pipes has been tested in an alternate embodiment. This embodiment employs a single heat pipe and a water bath to control the evaporator and condenser temperatures, and to demonstrate the benefit of local thickening.

Both embodiments indicate that local thickening in heat pipes results in improved $Q_{MAX}$ capacity. This benefit may be obtained solely by increasing the flow area available to the vapor. Even a 25% increase in the flow area results in a substantial performance improvement. This indicates that for vapor chambers, benefit may be much higher given that in portions the flow area is increased by 300%. One feature of this embodiment is the absence of the wick in patches, and more importantly, the strategic locations from which the wick may be removed so that the best outcome is obtained.

FIGS. 21-25 disclose a manufacturing method that may be used for any of the embodiments herein. This method is described by way of illustration, with particular reference to the embodiment that includes selective removal of portions of the wick.

Figure 23:
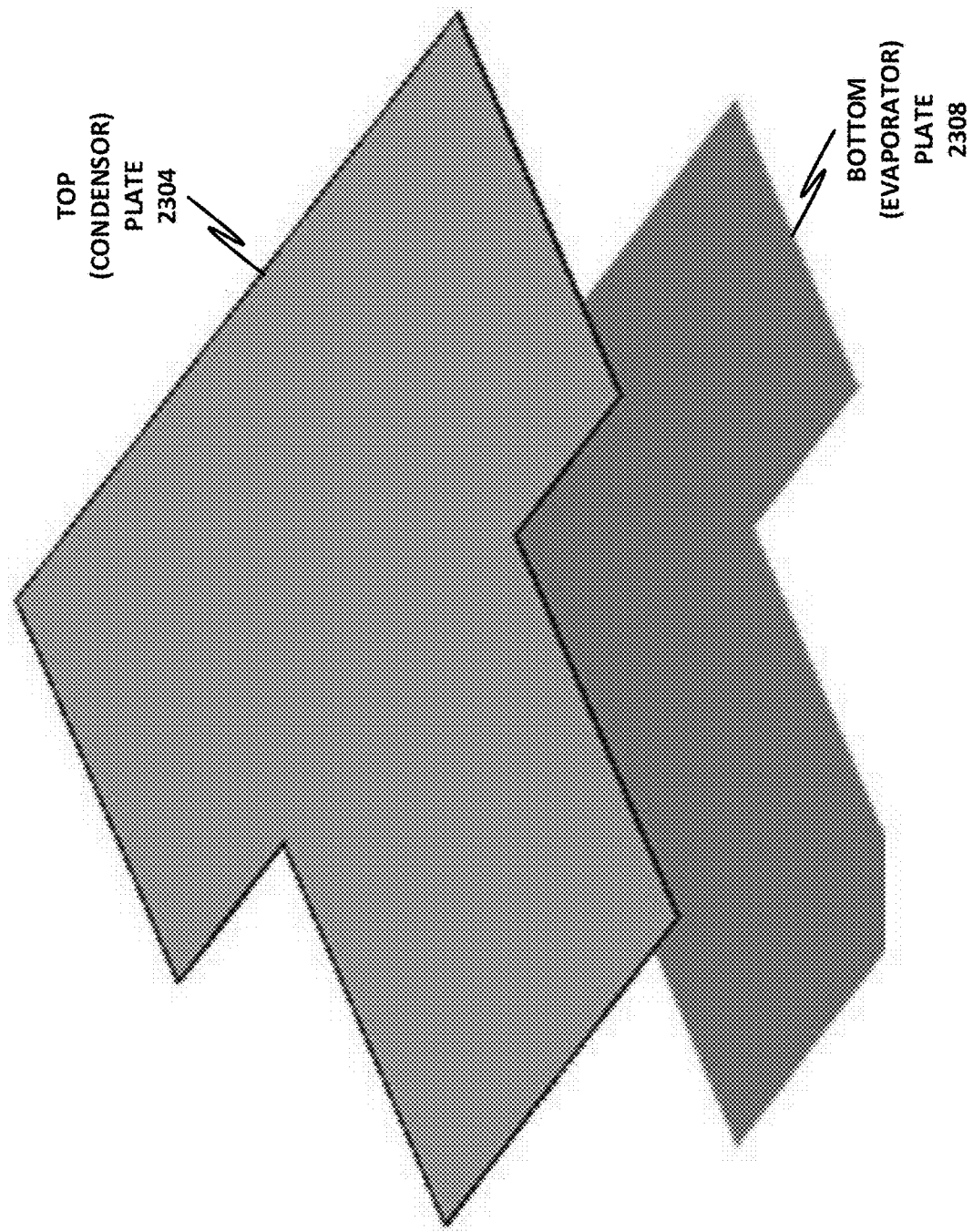
FIG. 23 is an illustration of a top plate, which may also be referred to as a condenser plate.
Figure 24:
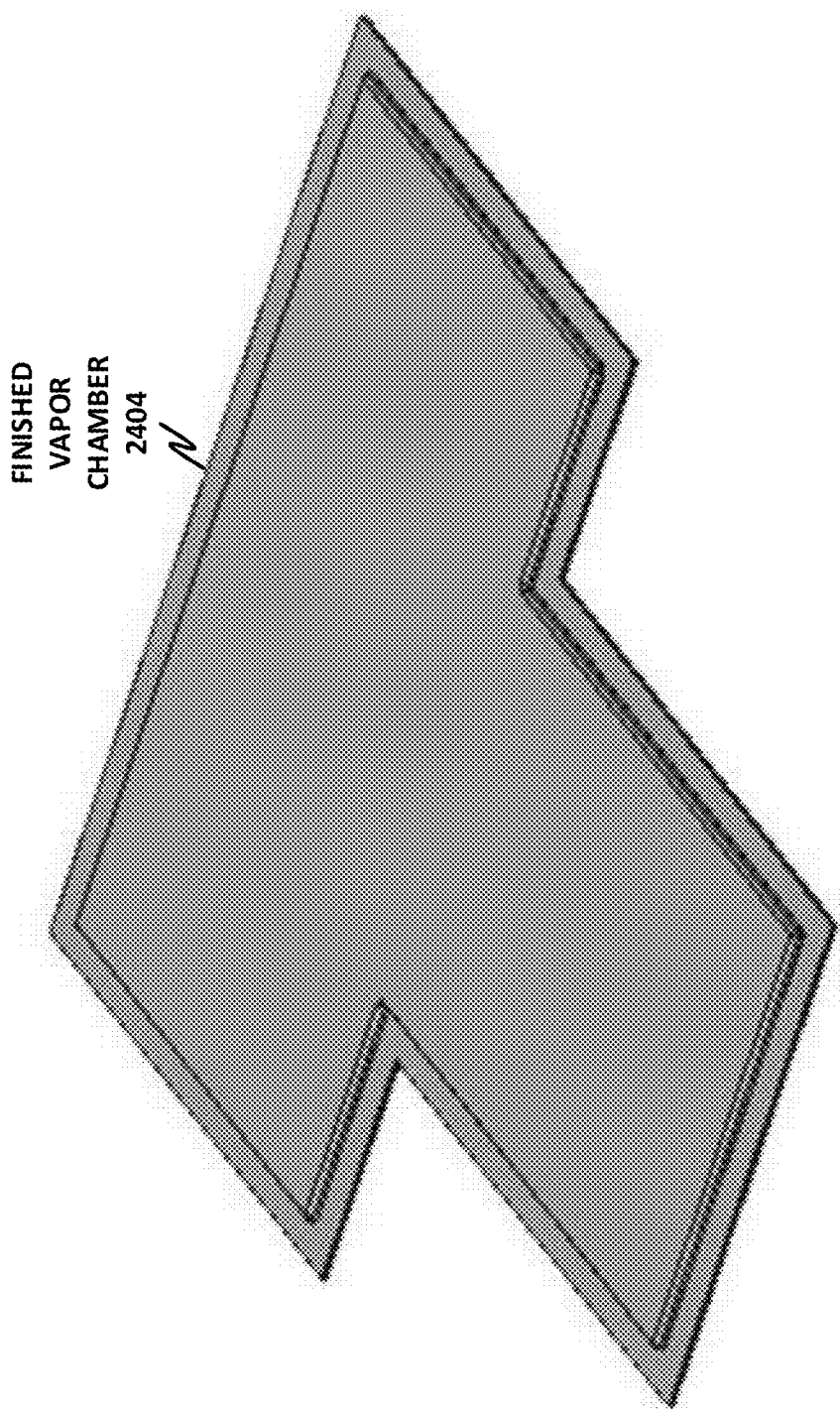
FIG. 24 is an illustration of a finished vapor chamber.
Figure 25:
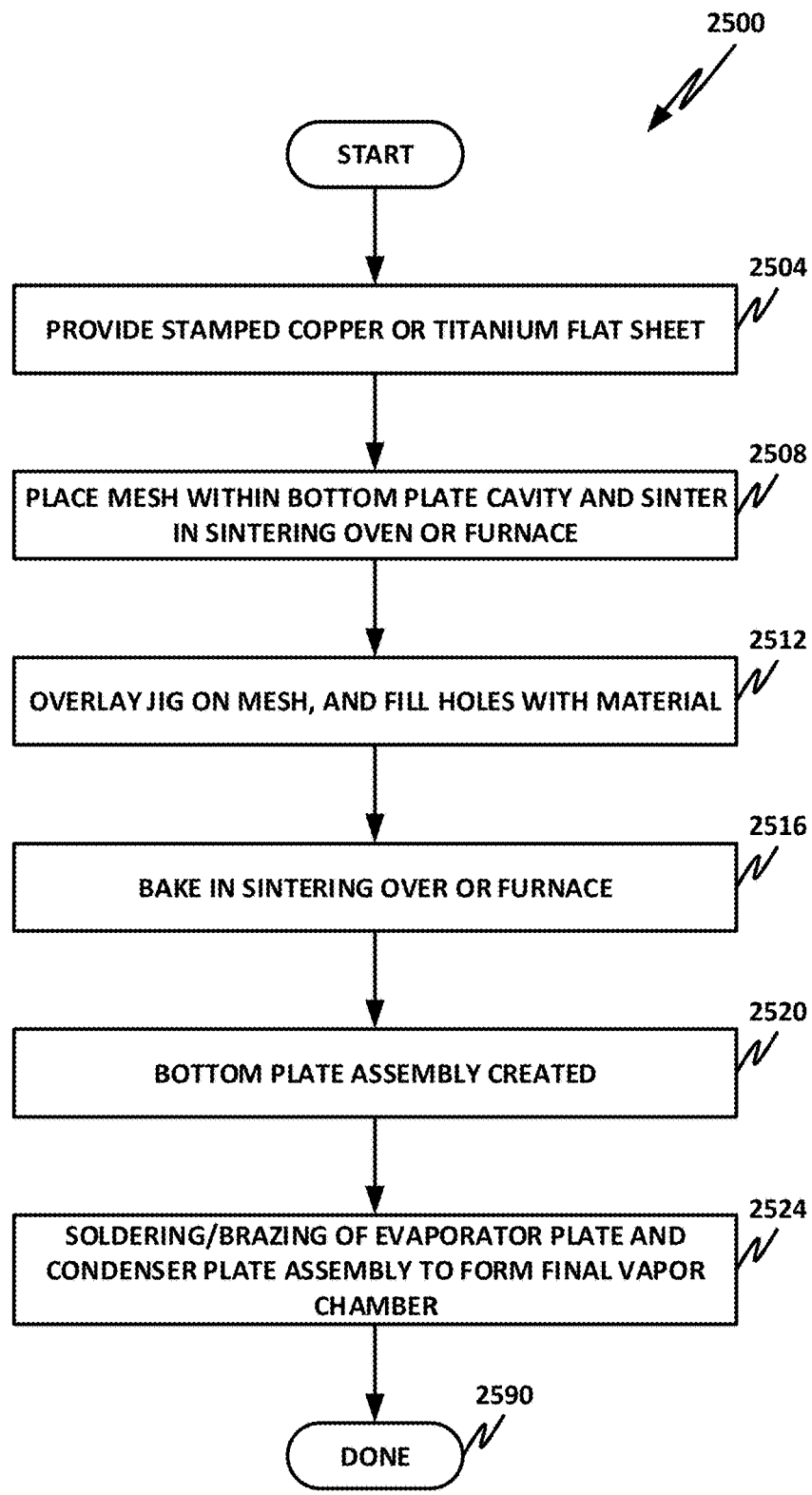
FIG. 25 is a flowchart of a method.

FIGS. 21-24 illustrate a step-by-step manufacturing process, while FIG. 25 provides a flowchart of a method 2500 of performing the manufacturing process.

Figure 21:
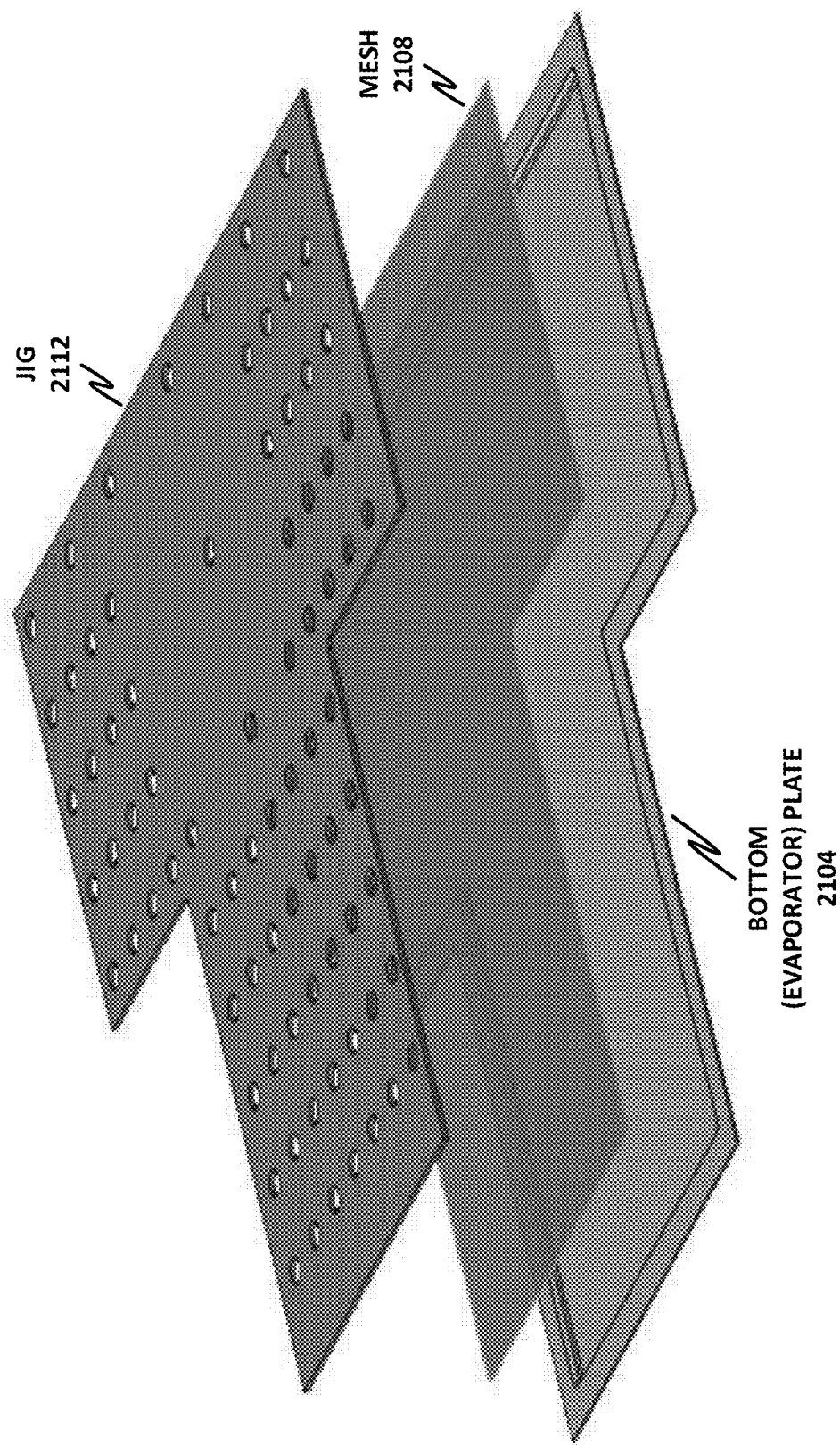
FIG. 21 is an illustration of a bottom plate, which may also be referred to as an evaporator plate.

In FIG. 21, there is shown a bottom plate 2104, which may also be referred to as an evaporator plate. By convention, bottom plate 2104 is sometimes called an evaporator plate because it is in contact with the heat source, and therefore fluid evaporates from bottom plate 2104. By convention, the top plate is sometimes called the condenser plate, because fluid condenses on the top plate, and then drips back down to be wicked back to the evaporator plate. These conventional uses may be confusing in light of other conventional uses that designate portions near the heat source as the "evaporator" or "evaporator region," and portions removed from the heat source as the "condenser" or "condenser region." In the industry, there is occasionally ambiguity. Some individuals or groups use "evaporator" to mean the bottom plate, and others use it to mean regions near the heat source. Other individuals or groups use "condenser" to mean the top plate, and others use it to mean regions removed from the heat source. To avoid ambiguity, throughout this specification the terms "hot plate," "evaporator," and "evaporator region" are used exclusively to refer to a portion of the vapor chamber that is near the heat source (i.e., regions that are hot enough that the cooling fluid exists as a vapor). The terms "bottom plate" and "evaporator plate" are used exclusively to refer to the bottom plate of the vapor chamber. The terms "cold plate," "condenser," and "condenser region" are used exclusively to refer to a portion of the vapor chamber that is removed from the heat source (i.e., regions that are cool enough that the cooling fluid exists as a condensate). The terms "top plate" and "condenser plate" are used exclusively to refer to the top plate of the vapor chamber.

In this example, evaporator plate 2104 may be manufactured according to a stamping or forging process, and may be made for example of a material such as copper, titanium, or some other conductive material that may have good anti-corrosive properties.

Overlaid on bottom plate 2104 is a mesh 2108. Mesh 2108 may for example be fiber braided or die cut. The material for mesh 2108 may be for example copper or titanium, or some other conductive metal. In some embodiments, mesh 2108 is made of the same material as bottom plate 2104, although this is not an absolute requirement.

A jig 2112 may be overlaid on mesh 2108. Jig 2112 can be used to form columns within the vapor chamber. For example, a stamped evaporator plate or bottom plate 2104 may have a "cavity" portion (i.e., a stamped depression in the metal). Mesh 2108 may be overlaid, such as by locating the mesh into the evaporator plate cavity. Sintering jig 2112 may then be laid on top of mesh 2108, and the holes within jig 2112 may be filled for example with copper or titanium powder. Both wick and columns may be omitted from certain regions of the assembly, as illustrated herein (regions where there are no columns formed). These regions may be selected to form a flow path for the evaporate, from the evaporator region to the condenser region. As described above, omitting wick and columns from these regions provides locally increased flow volume, with correspondingly increased cooling efficiency. In the illustration here, approximately 20% of the two-dimensional surface area of the vapor chamber is free of wick and columns.

Figure 22:
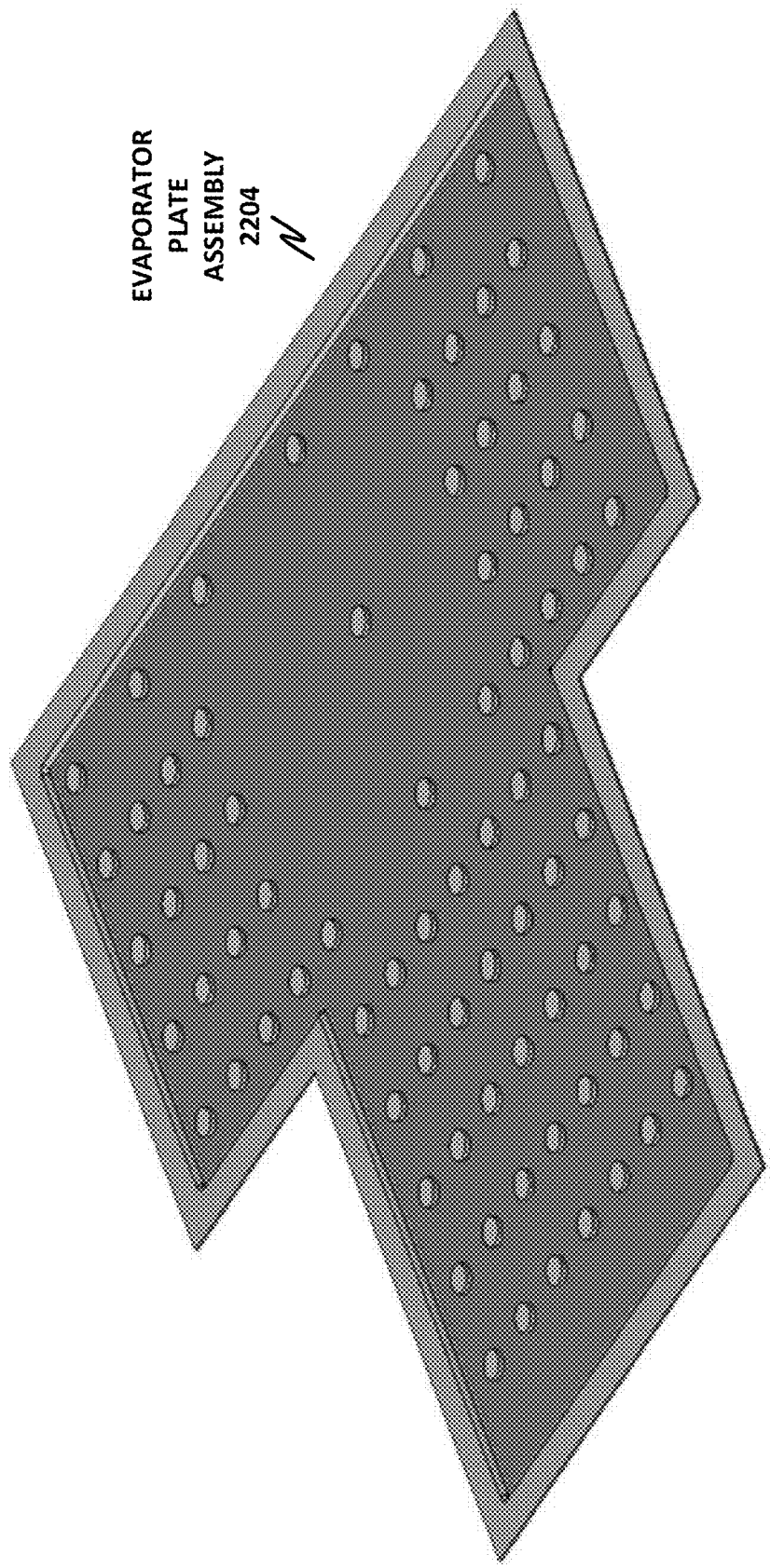
FIG. 22 is an illustration of a patched wick.

The assembly may then be baked in a sintering oven or furnace to provide the structure of FIG. 22.

FIG. 22 illustrates a patched wick 2204 that is a result of the sintering process described in connection with FIG. 21. After the sintering, the powdered aluminum or copper (or other material) hardens into pillars as illustrated. Notably, pillars and/or mesh may be absent from portions of the product to reduce pressure loss, as described in connection with FIGS. 15 through 20. Furthermore, sintering may be used to create a starburst or radial pattern, as illustrated in connection with FIGS. 6 through 14. The shape of the vapor chamber may be selected in accordance with the teachings illustrated in FIGS. 1 through 5.

After the sintering is complete, the evaporator plate assembly 2204 may be joined to a top plate, as illustrated in FIG. 23.

In this example, a top plate assembly 2304 is provided. Top plate 2304 is by convention sometimes referred to as the condenser plate, and in this illustration, the top plate assembly includes only the top plate. In manufacturing, top plate 2304 may also be stamped or forged into the desired shape. Then top plate 2304 may be welded or otherwise joined to bottom plate assembly 2308, such that a hermetic seal is formed. This ensures that vapor does not escape from the vapor chamber.

FIG. 24 illustrates a finished vapor chamber 2404, in which the top plate assembly and bottom plate assembly have been soldered or otherwise joined together.

FIG. 25 is a flowchart of a method 2500 that describes the process illustrated in FIGS. 21 through 24.

In block 2504, a stamped or forged copper or titanium flat sheet may be provided as the bottom plate or evaporator plate. Similarly, a stamped or forged sheet of the same or a different material may be provided as the evaporator plate.

In block 2508, the mesh is placed within the bottom plate cavity.

In block 2512, the jig is overlaid on the mesh and the holes are filled with appropriate material such as copper powder, titanium powder, or other powder or material.

In block 2516, the assembly is baked in a sintering oven or furnace.

The result is that in block 2520, the bottom plate assembly is created.

In block 2524, soldering, brazing, welding, gluing, or other joining methods may be used to join the evaporator plate and the condenser plate assembly to form the final vapor chamber.

In block 2590, the method is done.

Figure 26:
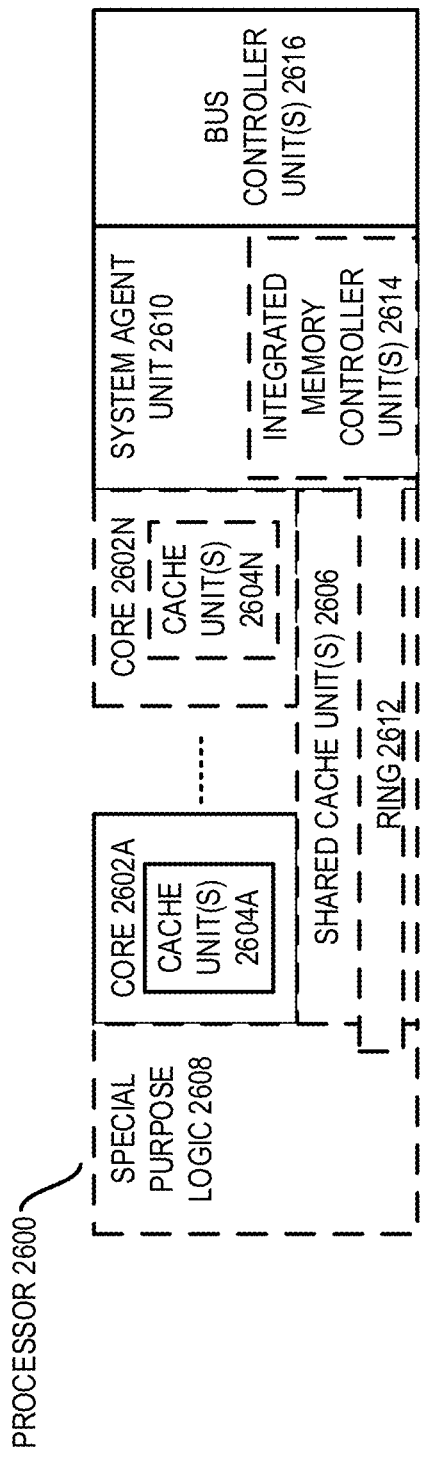
FIG. 26 is a block diagram of a processor that may have more than one core, may have an integrated memory controller, and may have integrated graphics according to one or more examples of the present specification.

FIG. 26 is a block diagram of a processor 2600 that may have more than one core, may have an integrated memory controller, and may have integrated graphics according to embodiments of the specification. The solid lined boxes in FIG. 26 illustrate a processor 2600 with a single core 2602A, a system agent 2610, a set of one or more bus controller units 2616, while the optional addition of the dashed lined boxes illustrates an alternative processor 2600 with multiple cores 2602A-N, cache units 2604A-N, a set of one or more integrated memory controller unit(s) 2614 in the system agent unit 2610, and special-purpose logic 2608.

Thus, different implementations of the processor 2600 may include: 1) a CPU with the special-purpose logic 2608 being integrated graphics and/or scientific (throughput) logic (which may include one or more cores), and the cores 2602A-N being one or more general purpose cores (e.g., general purpose in-order cores, general purpose out-of-order cores, a combination of the two); 2) a coprocessor with the cores 2602A-N being a large number of special-purpose cores intended primarily for graphics and/or scientific throughput; and 3) a coprocessor with the cores 2602A-N being a large number of general purpose in-order cores.

Thus, the processor 2600 may be a general purpose processor, coprocessor or special-purpose processor, such as, for example, a network or communication processor, compression engine, graphics processor, GPGPU, a high-throughput many integrated core (MIC) coprocessor (including 30 or more cores), embedded processor, or the like. The processor may be implemented on one or more chips. The processor 2600 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 2606, and external memory (not shown) coupled to the set of integrated memory controller units 2614. The set of shared cache units 2606 may include one or more mid-level caches, such as level 2 (L2), level 3 (L3), level 4 (L4), or other levels of cache, a last level cache (LLC), and/or combinations thereof. While in one embodiment a ring-based interconnect unit 2612 interconnects the integrated graphics logic 2608, the set of shared cache units 2606, and the system agent unit 2610/integrated memory controller unit(s) 2614, alternative embodiments may use any number of well-known techniques for interconnecting such units. In one embodiment, coherency is maintained between one or more cache units 2606 and cores 2602A-N.

In some embodiments, one or more of the cores 2602A-N are capable of multithreading. The system agent 2610 includes those components coordinating and operating cores 2602A-N. The system agent unit 2610 may include, for example, a power control unit (PCU) and a display unit. The PCU may be or include logic and components needed for regulating the power state of the cores 2602A-N and the integrated graphics logic 2608. The display unit is for driving one or more externally connected displays.

The cores 2602A-N may be homogenous or heterogeneous in terms of architecture instruction set; that is, two or more of the cores 2602A-N may be capable of executing the same instruction set, while others may be capable of executing only a subset of that instruction set or a different instruction set.

Example Computer Architectures

FIGS. 27-30 are block diagrams of example computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 27:
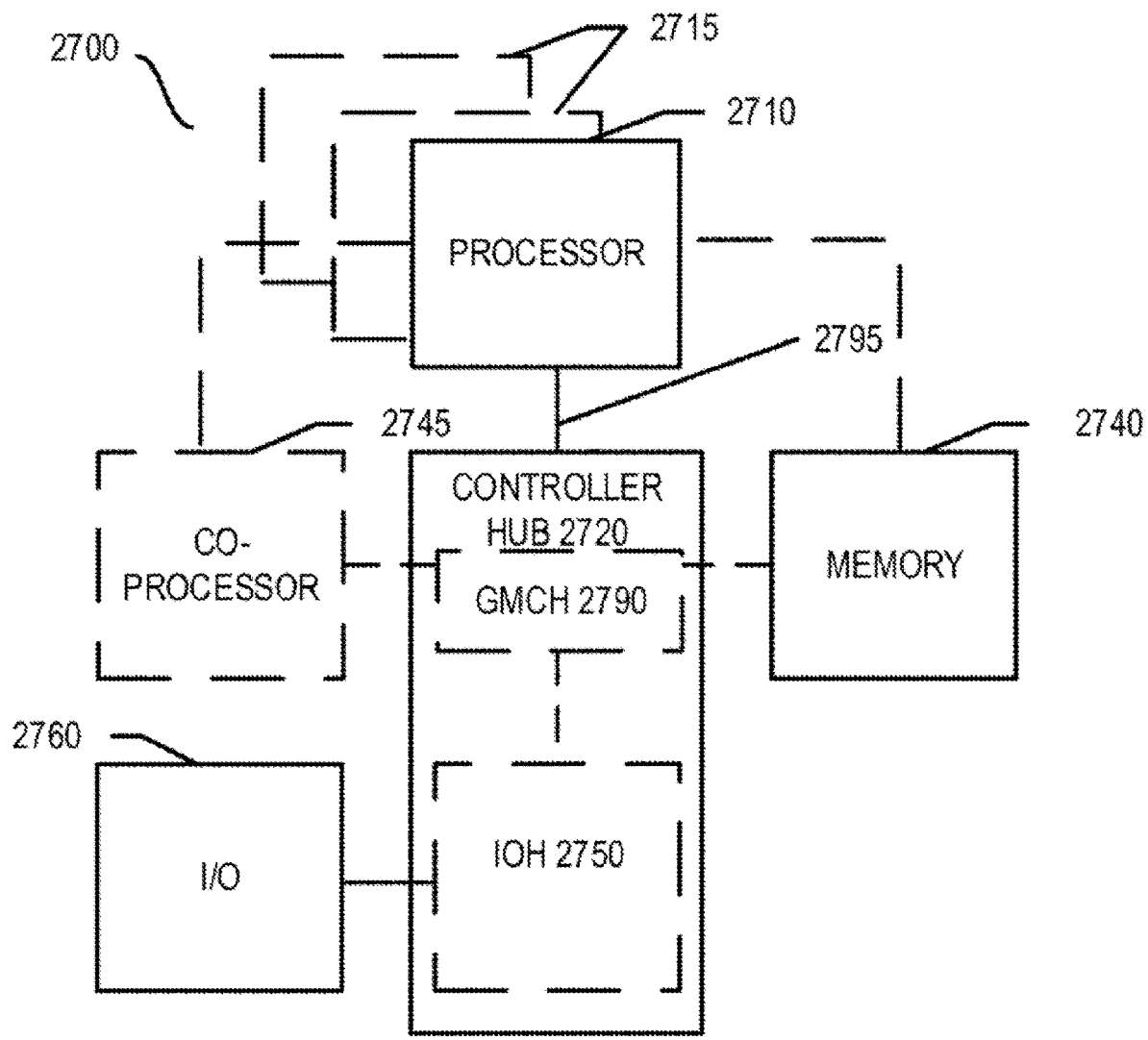
FIGS. 27-30 are block diagrams of computer architectures according to one or more examples of the present specification.

Referring now to FIG. 27, shown is a block diagram of a system 2700 in accordance with one embodiment. The system 2700 may include one or more processors 2710, 2715, which are coupled to a controller hub 2720. In one embodiment the controller hub 2720 includes a graphics memory controller hub (GMCH) 2790 and an input/output hub (IOH) 2750 (which may be on separate chips); the GMCH 2790 includes memory and graphics controllers to which are coupled memory 2740 and a coprocessor 2745; the IOH 2750 couples input/output (I/O) devices 2760 to the GMCH 2790. Alternatively, one or both of the memory and graphics controllers are integrated within the processor (as described herein), the memory 2740 and the coprocessor 2745 are coupled directly to the processor 2710, and the controller hub 2720 in a single chip with the IOH 2750.

The optional nature of additional processors 2715 is denoted in FIG. 27 with broken lines. Each processor 2710, 2715 may include one or more of the processing cores described herein and may be some version of the processor 2600.

The memory 2740 may be, for example, dynamic random access memory (DRAM), phase change memory (PCM), or a combination of the two. For at least one embodiment, the controller hub 2720 communicates with the processor(s) 2710, 2715 via a multidrop bus, such as a frontside bus (FSB), point-to-point interface such as Ultra Path Interconnect (UPI), or similar connection 2795.

In one embodiment, the coprocessor 2745 is a special-purpose processor, such as, for example, a high-throughput MIC processor, a network or communication processor, compression engine, graphics processor, GPGPU, embedded processor, or the like. In one embodiment, controller hub 2720 may include an integrated graphics accelerator.

There can be a variety of differences between the physical resources 2710, 2715 in terms of a spectrum of metrics of merit including architectural, microarchitectural, thermal, power consumption characteristics, and the like.

In one embodiment, the processor 2710 executes instructions that control data processing operations of a general type. Embedded within the instructions may be coprocessor instructions. The processor 2710 recognizes these coprocessor instructions as being of a type that should be executed by the attached coprocessor 2745. Accordingly, the processor 2710 issues these coprocessor instructions (or control signals representing coprocessor instructions) on a coprocessor bus or other interconnect, to coprocessor 2745. Coprocessor(s) 2745 accepts and executes the received coprocessor instructions.

Figure 28:
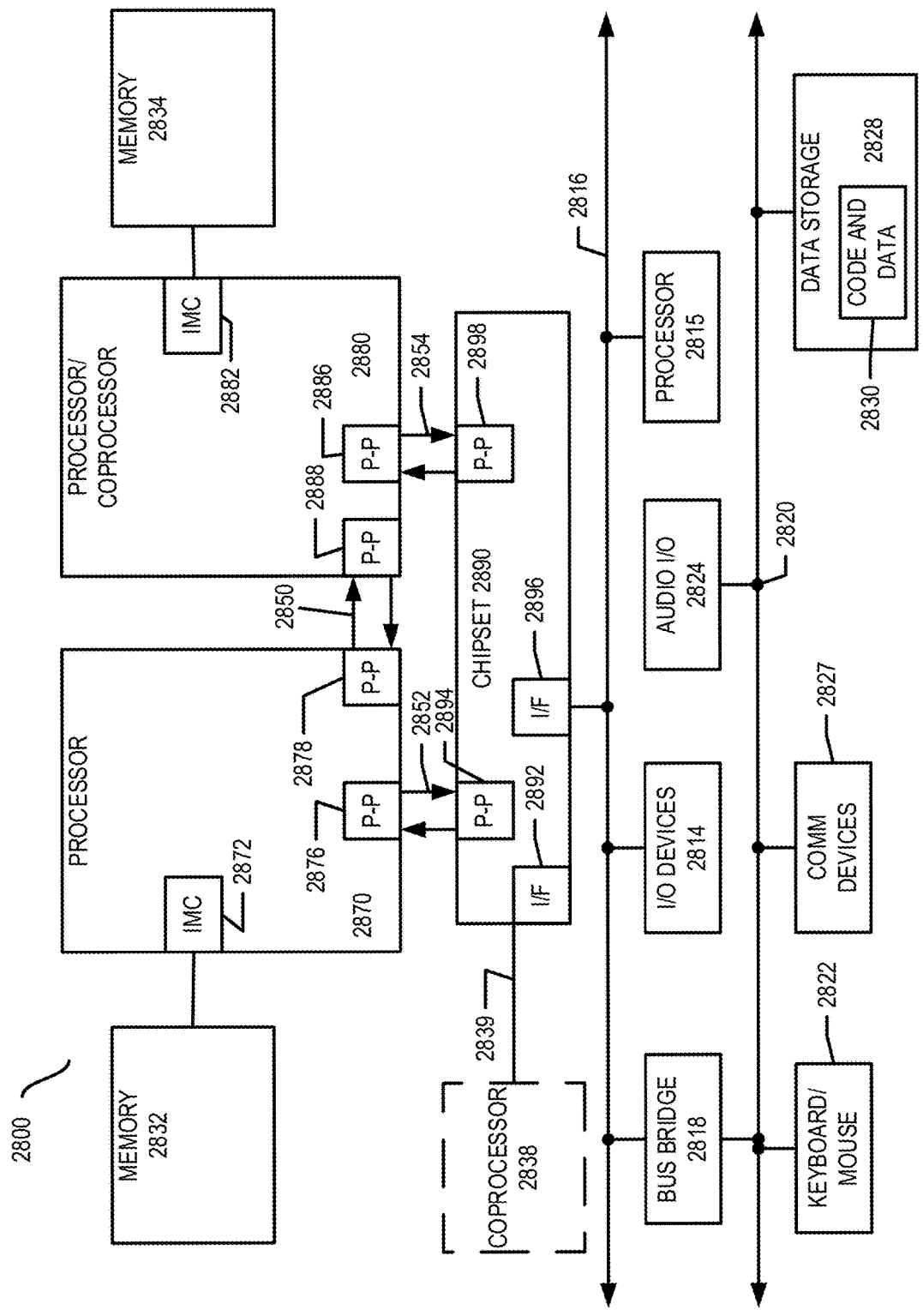

Referring now to FIG. 28, shown is a block diagram of a first more specific example system 2800. As shown in FIG. 28, multiprocessor system 2800 is a point-to-point interconnect system, and includes a first processor 2870 and a second processor 2880 coupled via a point-to-point interconnect 2850. Each of processors 2870 and 2880 may be some version of the processor 2600. In one embodiment, processors 2870 and 2880 are respectively processors 2710 and 2715, while coprocessor 2838 is coprocessor 2745. In another embodiment, processors 2870 and 2880 are respectively processor 2710 coprocessor 2745.

Processors 2870 and 2880 are shown including integrated memory controller (IMC) units 2872 and 2882, respectively. Processor 2870 also includes as part of its bus controller units point-to-point (P-P) interfaces 2876 and 2878; similarly, second processor 2880 includes P-P interfaces 2886 and 2888. Processors 2870, 2880 may exchange information via a point-to-point (P-P) interface 2850 using P-P interface circuits 2878, 2888. As shown in FIG. 28, IMCs 2872 and 2882 couple the processors to respective memories, namely a memory 2832 and a memory 2834, which may be portions of main memory locally attached to the respective processors.

Processors 2870, 2880 may each exchange information with a chipset 2890 via individual P-P interfaces 2852, 2854 using point-to-point interface circuits 2876, 2894, 2886, 2898. Chipset 2890 may optionally exchange information with the coprocessor 2838 via a high-performance interface 2839. In one embodiment, the coprocessor 2838 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 2890 may be coupled to a first bus 2816 via an interface 2896. In one embodiment, first bus 2816 may be a peripheral component interconnect (PCI) bus, or a bus such as a PCI Express bus or another third generation input/output (IO) interconnect bus, by way of nonlimiting example.

As shown in FIG. 28, various IO devices 2814 may be coupled to first bus 2816, along with a bus bridge 2818 which couples first bus 2816 to a second bus 2820. In one embodiment, one or more additional processor(s) 2815, such as coprocessors, high-throughput MIC processors, GPGPUs, accelerators (such as, e.g., graphics accelerators or DSP units), field programmable gate arrays, or any other processor, are coupled to first bus 2816. In one embodiment, second bus 2820 may be a low pin count (LPC) bus. Various devices may be coupled to a second bus 2820 including, for example, a keyboard and/or mouse 2822, communication devices 2827 and a storage unit 2828 such as a disk drive or other mass storage device which may include instructions or code and data 2830, in one embodiment. Further, an audio IO 2824 may be coupled to the second bus 2820. Note that other architectures are possible. For example, instead of the point-to-point architecture of FIG. 28, a system may implement a multidrop bus or other such architecture.

Figure 29:
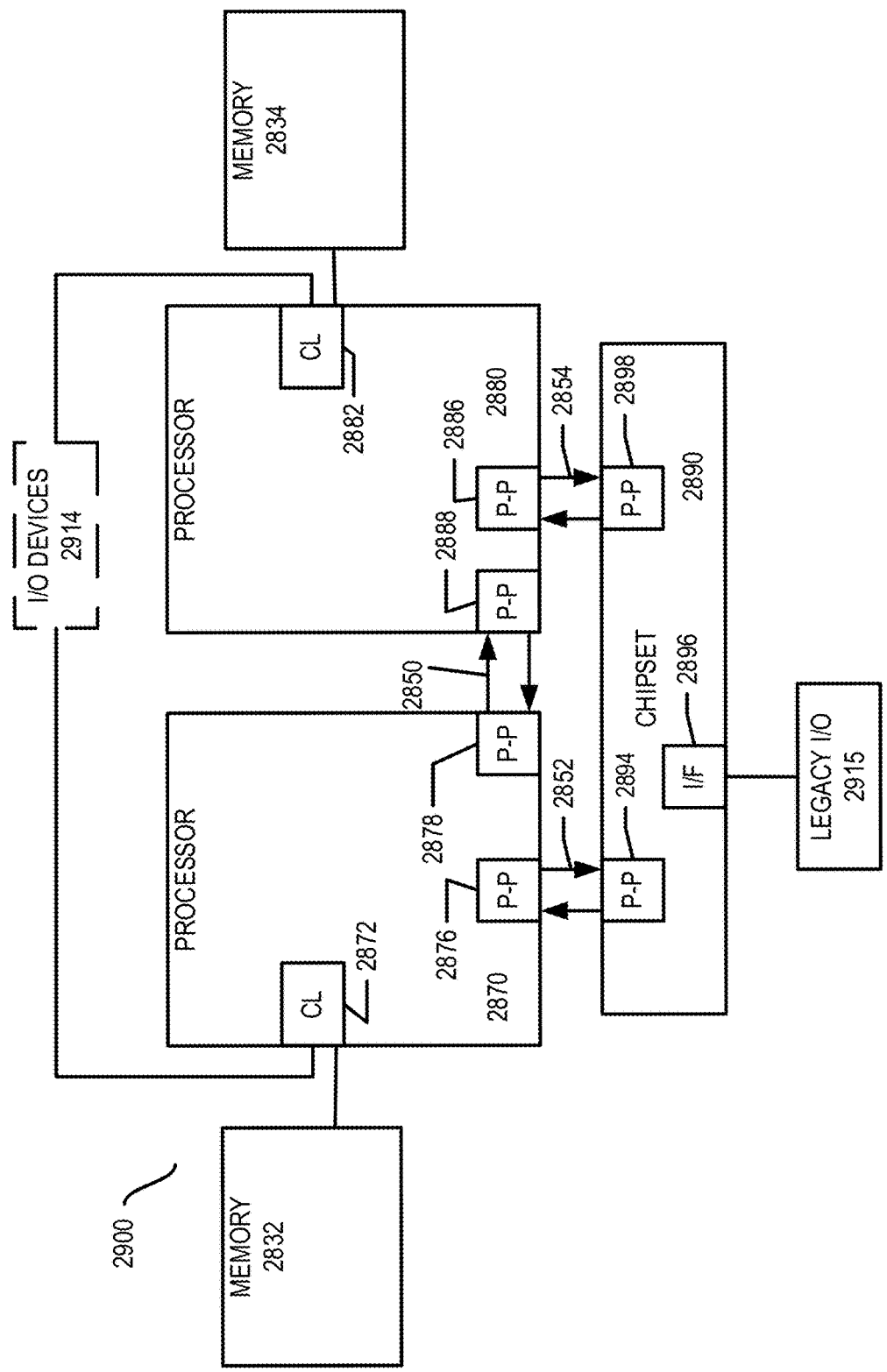

Referring now to FIG. 29, shown is a block diagram of a second more specific example system 2900. FIGS. 28 and 29 bear like reference numerals, and certain aspects of FIG. 28 have been omitted from FIG. 29 in order to avoid obscuring other aspects of FIG. 29.

FIG. 29 illustrates that the processors 2870, 2880 may include integrated memory and IO control logic ("CL") 2872 and 2882, respectively. Thus, the CL 2872, 2882 include IMC units and include IO control logic. FIG. 29 illustrates that not only are the memories 2832, 2834 coupled to the CL 2872, 2882, but also that IO devices 2914 are also coupled to the control logic 2872, 2882. Legacy IO devices 2915 are coupled to the chipset 2890.

Figure 30:
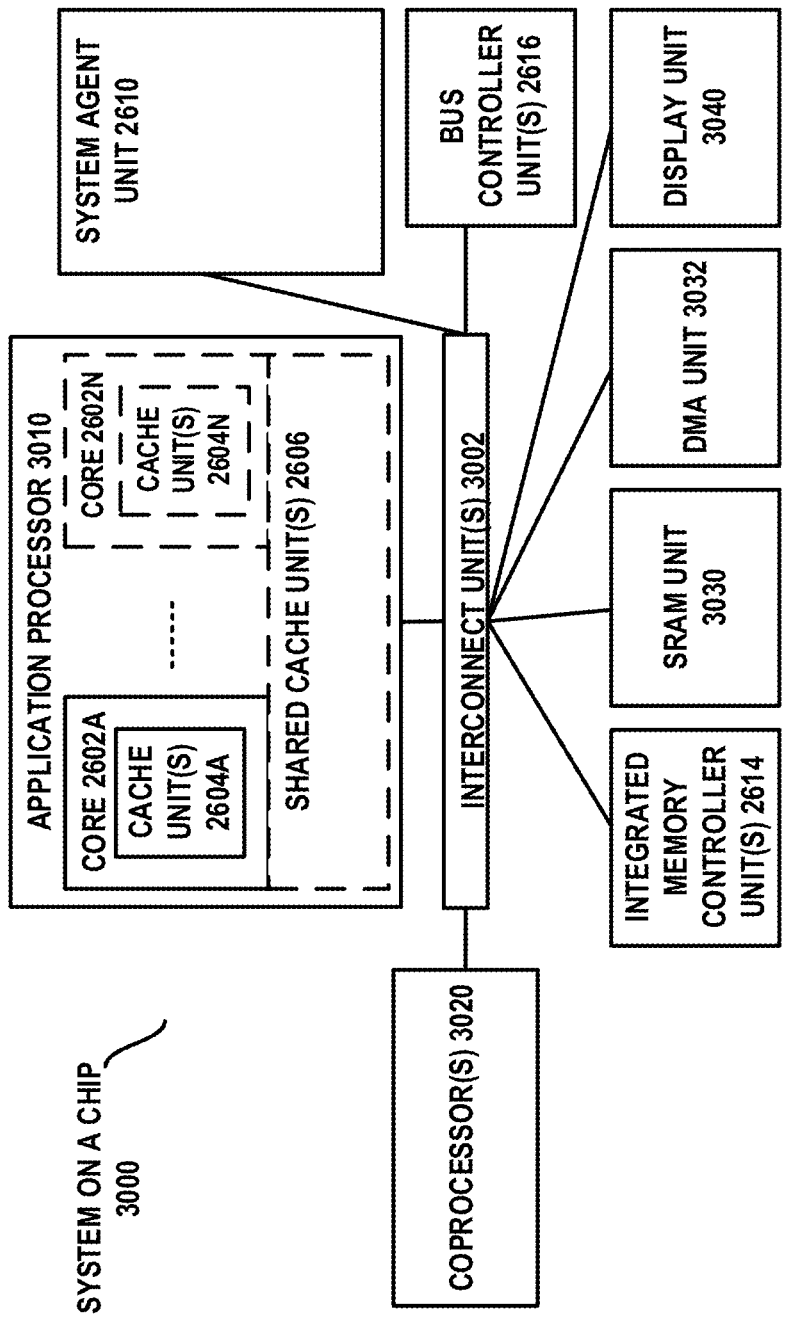

Referring now to FIG. 30, shown is a block diagram of a system-on-a-chip (SoC) 3000 in accordance with an embodiment. Similar elements in FIG. 26 bear like reference numerals. Also, dashed lined boxes are optional features on more advanced SoCs. In FIG. 30, an interconnect unit(s) 3002 is coupled to: an application processor 3010 which includes a set of one or more cores 2602A-N and shared cache unit(s) 2606; a system agent unit 2610; a bus controller unit(s) 2616; IMC unit(s) 2614; a set of one or more coprocessors 3020 which may include integrated graphics logic, an image processor, an audio processor, and a video processor; a static random access memory (SRAM) unit 3030; a direct memory access (DMA) unit 3032; and a display unit 3040 for coupling to one or more external displays. In one embodiment, the coprocessor(s) 3020 includes a special-purpose processor, such as, for example, a network or communication processor, compression engine, GPGPU, a high-throughput MIC processor, embedded processor, or the like.

Figure 31:
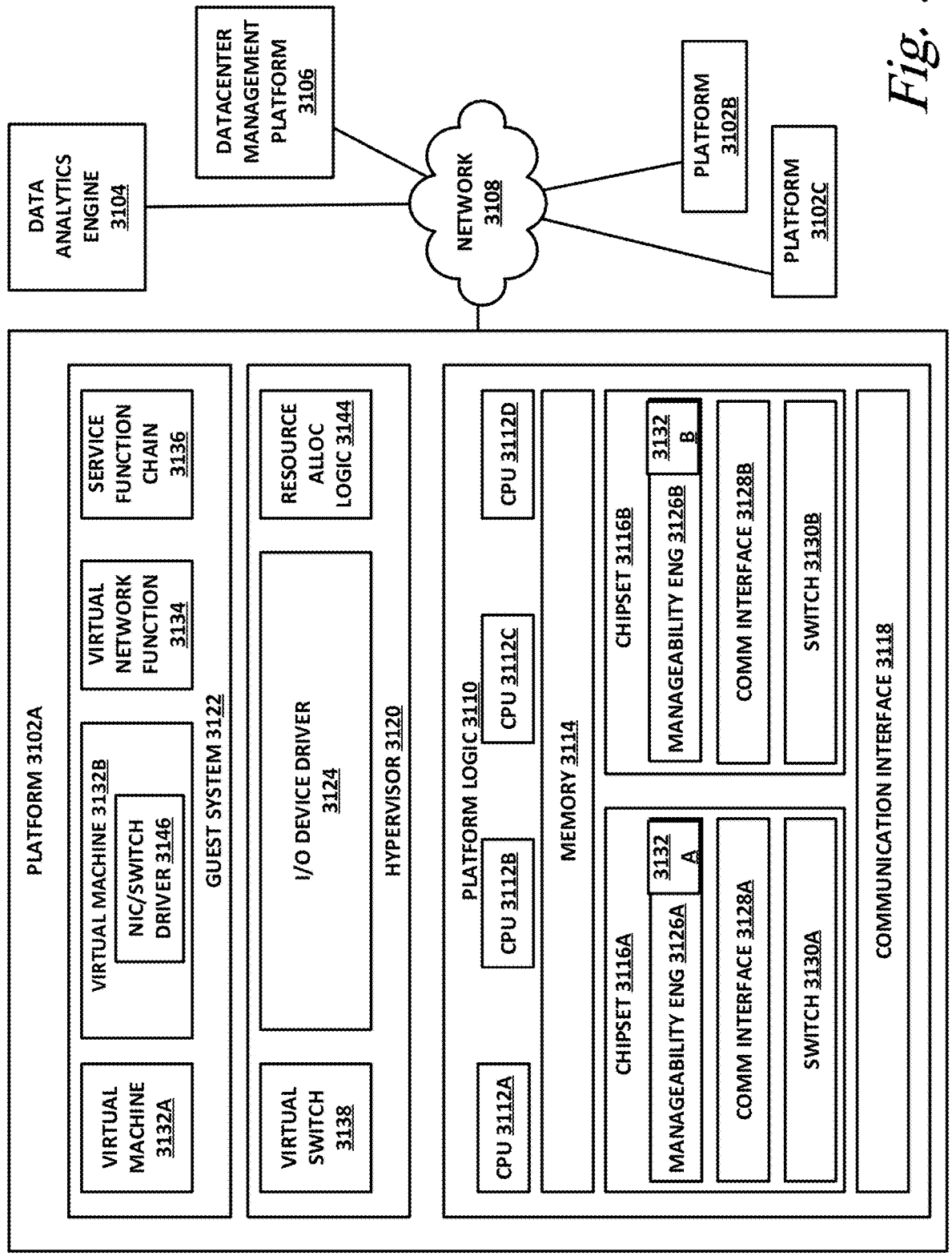
FIG. 31 is a block diagram of components of a computing platform.

FIG. 31 is a block diagram of components of a computing platform 3102A. In the embodiment depicted, hardware platforms 3102A, 3102B, and 3102C, along with a data center management platform 3106 and data analytics engine 3104 are interconnected via network 3108. In other embodiments, a computer system may include any suitable number of (i.e., one or more) platforms, including hardware, software, firmware, and other components. In some embodiments (e.g., when a computer system only includes a single platform), all or a portion of the system management platform 3106 may be included on a platform 3102. A platform 3102 may include platform logic 3110 with one or more CPUs 3112, memories 3114 (which may include any number of different modules), chipsets 3116, communication interfaces 3118, and any other suitable hardware and/or software to execute a hypervisor 3120 or other operating system capable of executing workloads associated with applications running on platform 3102. In some embodiments, a platform 3102 may function as a host platform for one or more guest systems 3122 that invoke these applications. Platform 3102A may represent any suitable computing environment, such as a high-performance computing environment, a data center, a communications service provider infrastructure (e.g., one or more portions of an Evolved Packet Core), an in-memory computing environment, a computing system of a vehicle (e.g., an automobile or airplane), an Internet of Things environment, an industrial control system, other computing environment, or combination thereof.

In various embodiments of the present disclosure, accumulated stress and/or rates of stress accumulated of a plurality of hardware resources (e.g., cores and uncores) are monitored and entities (e.g., system management platform 3106, hypervisor 3120, or other operating system) of computer platform 3102A may assign hardware resources of platform logic 3110 to perform workloads in accordance with the stress information. In some embodiments, self-diagnostic capabilities may be combined with the stress monitoring to more accurately determine the health of the hardware resources. Each platform 3102 may include platform logic 3110. Platform logic 3110 comprises, among other logic enabling the functionality of platform 3102, one or more CPUs 3112, memory 3114, one or more chipsets 3116, and communication interfaces 3128. Although three platforms are illustrated, computer platform 3102A may be interconnected with any suitable number of platforms. In various embodiments, a platform 3102 may reside on a circuit board that is installed in a chassis, rack, or other suitable structure that comprises multiple platforms coupled together through network 3108 (which may comprise, e.g., a rack or backplane switch).

CPUs 3112 may each comprise any suitable number of processor cores and supporting logic (e.g., uncores). The cores may be coupled to each other, to memory 3114, to at least one chipset 3116, and/or to a communication interface 3118, through one or more controllers residing on CPU 3112 and/or chipset 3116. In particular embodiments, a CPU 3112 is embodied within a socket that is permanently or removably coupled to platform 3102A. Although four CPUs are shown, a platform 3102 may include any suitable number of CPUs.

Memory 3114 may comprise any form of volatile or nonvolatile memory including, without limitation, magnetic media (e.g., one or more tape drives), optical media, random access memory (RAM), read-only memory (ROM), flash memory, removable media, or any other suitable local or remote memory component or components. Memory 3114 may be used for short, medium, and/or long-term storage by platform 3102A. Memory 3114 may store any suitable data or information utilized by platform logic 3110, including software embedded in a computer-readable medium, and/or encoded logic incorporated in hardware or otherwise stored (e.g., firmware). Memory 3114 may store data that is used by cores of CPUs 3112. In some embodiments, memory 3114 may also comprise storage for instructions that may be executed by the cores of CPUs 3112 or other processing elements (e.g., logic resident on chipsets 3116) to provide functionality associated with the manageability engine 3126 or other components of platform logic 3110. A platform 3102 may also include one or more chipsets 3116 comprising any suitable logic to support the operation of the CPUs 3112. In various embodiments, chipset 3116 may reside on the same die or package as a CPU 3112 or on one or more different dies or packages. Each chipset may support any suitable number of CPUs 3112. A chipset 3116 may also include one or more controllers to couple other components of platform logic 3110 (e.g., communication interface 3118 or memory 3114) to one or more CPUs. In the embodiment depicted, each chipset 3116 also includes a manageability engine 3126. Manageability engine 3126 may include any suitable logic to support the operation of chipset 3116. In a particular embodiment, a manageability engine 3126 (which may also be referred to as an innovation engine) is capable of collecting real-time telemetry data from the chipset 3116, the CPU(s) 3112 and/or memory 3114 managed by the chipset 3116, other components of platform logic 3110, and/or various connections between components of platform logic 3110. In various embodiments, the telemetry data collected includes the stress information described herein.

In various embodiments, a manageability engine 3126 operates as an out-of-band asynchronous compute agent which is capable of interfacing with the various elements of platform logic 3110 to collect telemetry data with no or minimal disruption to running processes on CPUs 3112. For example, manageability engine 3126 may comprise a dedicated processing element (e.g., a processor, controller, or other logic) on chipset 3116, which provides the functionality of manageability engine 3126 (e.g., by executing software instructions), thus conserving processing cycles of CPUs 3112 for operations associated with the workloads performed by the platform logic 3110. Moreover, the dedicated logic for the manageability engine 3126 may operate asynchronously with respect to the CPUs 3112 and may gather at least some of the telemetry data without increasing the load on the CPUs.

A manageability engine 3126 may process telemetry data it collects (specific examples of the processing of stress information are provided herein). In various embodiments, manageability engine 3126 reports the data it collects and/or the results of its processing to other elements in the computer system, such as one or more hypervisors 3120 or other operating systems and/or system management software (which may run on any suitable logic such as system management platform 3106). In particular embodiments, a critical event such as a core that has accumulated an excessive amount of stress may be reported prior to the normal interval for reporting telemetry data (e.g., a notification may be sent immediately upon detection).

Additionally, manageability engine 3126 may include programmable code configurable to set which CPU(s) 3112 a particular chipset 3116 manages and/or which telemetry data may be collected.

Chipsets 3116 also each include a communication interface 3128. Communication interface 3128 may be used for the communication of signaling and/or data between chipset 3116 and one or more I/O devices, one or more networks 3108, and/or one or more devices coupled to network 3108 (e.g., system management platform 3106). For example, communication interface 3128 may be used to send and receive network traffic such as data packets. In a particular embodiment, a communication interface 3128 comprises one or more physical network interface controllers (NICs), also known as network interface cards or network adapters. A NIC may include electronic circuitry to communicate using any suitable physical layer and data link layer standard such as Ethernet (e.g., as defined by a IEEE 802.3 standard), Fibre Channel, InfiniBand, Wi-Fi, or other suitable standard. A NIC may include one or more physical ports that may couple to a cable (e.g., an Ethernet cable). A NIC may enable communication between any suitable element of chipset 3116 (e.g., manageability engine 3126 or switch 3130) and another device coupled to network 3108. In various embodiments a NIC may be integrated with the chipset (i.e., may be on the same integrated circuit or circuit board as the rest of the chipset logic) or may be on a different integrated circuit or circuit board that is electromechanically coupled to the chipset.

In particular embodiments, communication interfaces 3128 may allow communication of data (e.g., between the manageability engine 3126 and the data center management platform 3106) associated with management and monitoring functions performed by manageability engine 3126. In various embodiments, manageability engine 3126 may utilize elements (e.g., one or more NICs) of communication interfaces 3128 to report the telemetry data (e.g., to system management platform 3106) in order to reserve usage of NICs of communication interface 3118 for operations associated with workloads performed by platform logic 3110.

Switches 3130 may couple to various ports (e.g., provided by NICs) of communication interface 3128 and may switch data between these ports and various components of chipset 3116 (e.g., one or more Peripheral Component Interconnect Express (PCIe) lanes coupled to CPUs 3112). Switches 3130 may be a physical or virtual (i.e., software) switch.

Platform logic 3110 may include an additional communication interface 3118. Similar to communication interfaces 3128, communication interfaces 3118 may be used for the communication of signaling and/or data between platform logic 3110 and one or more networks 3108 and one or more devices coupled to the network 3108. For example, communication interface 3118 may be used to send and receive network traffic such as data packets. In a particular embodiment, communication interfaces 3118 comprise one or more physical NICs. These NICs may enable communication between any suitable element of platform logic 3110 (e.g., CPUs 3112 or memory 3114) and another device coupled to network 3108 (e.g., elements of other platforms or remote computing devices coupled to network 3108 through one or more networks).

Platform logic 3110 may receive and perform any suitable types of workloads. A workload may include any request to utilize one or more resources of platform logic 3110, such as one or more cores or associated logic. For example, a workload may comprise a request to instantiate a software component, such as an I/O device driver 3124 or guest system 3122; a request to process a network packet received from a virtual machine 3132 or device external to platform 3102A (such as a network node coupled to network 3108); a request to execute a process or thread associated with a guest system 3122, an application running on platform 3102A, a hypervisor 3120 or other operating system running on platform 3102A; or other suitable processing request.

A virtual machine 3132 may emulate a computer system with its own dedicated hardware. A virtual machine 3132 may run a guest operating system on top of the hypervisor 3120. The components of platform logic 3110 (e.g., CPUs 3112, memory 3114, chipset 3116, and communication interface 3118) may be virtualized such that it appears to the guest operating system that the virtual machine 3132 has its own dedicated components.

A virtual machine 3132 may include a virtualized NIC (vNIC), which is used by the virtual machine as its network interface. A vNIC may be assigned a media access control (MAC) address or other identifier, thus allowing multiple virtual machines 3132 to be individually addressable in a network.

VNF 3134 may comprise a software implementation of a functional building block with defined interfaces and behavior that can be deployed in a virtualized infrastructure. In particular embodiments, a VNF 3134 may include one or more virtual machines 3132 that collectively provide specific functionalities (e.g., WAN optimization, virtual private network (VPN) termination, firewall operations, load balancing operations, security functions, etcetera). A VNF 3134 running on platform logic 3110 may provide the same functionality as traditional network components implemented through dedicated hardware. For example, a VNF 3134 may include components to perform any suitable network function virtualization (NFV) workloads, such as virtualized evolved packet core (vEPC) components, mobility management entities, 3rd Generation Partnership Project (3GPP) control and data plane components, etc.

SFC 3136 is a group of VNFs 3134 organized as a chain to perform a series of operations, such as network packet processing operations. Service function chaining may provide the ability to define an ordered list of network services (e.g. firewalls, load balancers) that are stitched together in the network to create a service chain.

A hypervisor 3120 (also known as a virtual machine monitor) may comprise logic to create and run guest systems 3122. The hypervisor 3120 may present guest operating systems run by virtual machines with a virtual operating platform (i.e., it appears to the virtual machines that they are running on separate physical nodes when they are actually consolidated onto a single hardware platform) and manage the execution of the guest operating systems by platform logic 3110. Services of hypervisor 3120 may be provided by virtualizing in software or through hardware assisted resources that require minimal software intervention, or both. Multiple instances of a variety of guest operating systems may be managed by the hypervisor 3120. Each platform 3102 may have a separate instantiation of a hypervisor 3120.

Hypervisor 3120 may be a native or bare metal hypervisor that runs directly on platform logic 3110 to control the platform logic and manage the guest operating systems. Alternatively, hypervisor 3120 may be a hosted hypervisor that runs on a host operating system and abstracts the guest operating systems from the host operating system. Hypervisor 3120 may include a virtual switch 3138 that may provide virtual switching and/or routing functions to virtual machines of guest systems 3122. The virtual switch 3138 may comprise a logical switching fabric that couples the vNICs of the virtual machines 3132 to each other, thus creating a virtual network through which virtual machines may communicate with each other.

Virtual switch 3138 may comprise a software element that is executed using components of platform logic 3110. In various embodiments, hypervisor 3120 may be in communication with any suitable entity (e.g., a software-defined networking controller) which may cause hypervisor 3120 to reconfigure the parameters of virtual switch 3138 in response to changing conditions in platform 3102 (e.g., the addition or deletion of virtual machines 3132 or identification of optimizations that may be made to enhance performance of the platform).

Hypervisor 3120 may also include resource allocation logic 3144, which may include logic for determining allocation of platform resources based on the telemetry data (which may include stress information). Resource allocation logic 3144 may also include logic for communicating with various components of platform logic 3110 entities of platform 3102A to implement such optimization, such as components of platform logic 3110.

Any suitable logic may make one or more of these optimization decisions. For example, system management platform 3106; resource allocation logic 3144 of hypervisor 3120 or other operating system; or other logic of computer platform 3102A may be capable of making such decisions. In various embodiments, the system management platform 3106 may receive telemetry data from and manage workload placement across multiple platforms 3102. The system management platform 3106 may communicate with hypervisors 3120 (e.g., in an out-of-band manner) or other operating systems of the various platforms 3102 to implement workload placements directed by the system management platform.

The elements of platform logic 3110 may be coupled together in any suitable manner. For example, a bus may couple any of the components together. A bus may include any known interconnect, such as a multidrop bus, a mesh interconnect, a ring interconnect, a point-to-point interconnect, a serial interconnect, a parallel bus, a coherent (e.g. cache coherent) bus, a layered protocol architecture, a differential bus, or a Gunning transceiver logic (GTL) bus.

Elements of the computer platform 3102A may be coupled together in any suitable manner such as through one or more networks 3108. A network 3108 may be any suitable network or combination of one or more networks operating using one or more suitable networking protocols. A network may represent a series of nodes, points, and interconnected communication paths for receiving and transmitting packets of information that propagate through a communication system. For example, a network may include one or more firewalls, routers, switches, security appliances, antivirus servers, or other useful network devices.

Embodiments of the mechanisms disclosed herein may be implemented in hardware, software, firmware, or a combination of such implementation approaches. Some embodiments may be implemented as computer programs or program code executing on programmable systems comprising at least one processor, a storage system (including volatile and nonvolatile memory and/or storage elements), at least one input device, and at least one output device.

Program code, such as code 2830 illustrated in FIG. 28, may be applied to input instructions to perform the functions described herein and generate output information. The output information may be applied to one or more output devices, in known fashion. For purposes of this application, a processing system includes any system that has a processor, such as, for example, a DSP, a microcontroller, an application-specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "intellectual property (IP) cores" may be stored on a tangible, machine-readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard discs, any other type of disk including floppy disks, optical disks, compact disc read-only memories (CD-ROMs), compact disc rewritables (CD-RWs), and magneto-optical disks, semiconductor devices such as ROMs, RAMs such as DRAMs, SRAMs, erasable programmable read-only memories (EPROMs), flash memories, electrically erasable programmable read-only memories (EEPROMs), PCM, magnetic or optical cards, or any other type of media suitable for storing electronic instructions.

Accordingly, some embodiments also include non-transitory, tangible machine-readable media containing instructions or containing design data, such as Hardware Description Language (HDL), which defines structures, circuits, apparatuses, processors and/or system features described herein. Such embodiments may also be referred to as program products.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present specification.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

In the foregoing description, certain aspects of some or all embodiments are described in greater detail than is strictly necessary for practicing the appended claims. These details are provided by way of nonlimiting example only, for the purpose of providing context and illustration of the disclosed embodiments. Such details should not be understood to be required, and should not be "read into" the claims as limitations. The phrase may refer to "an embodiment" or "embodiments." These phrases, and any other references to embodiments, should be understood broadly to refer to any combination of one or more embodiments. Furthermore, the several features disclosed in a particular "embodiment" could just as well be spread across multiple embodiments. For example, if features 1 and 2 are disclosed in "an embodiment," embodiment A may have feature 1 but lack feature 2, while embodiment B may have feature 2 but lack feature 1.

This specification may provide illustrations in a block diagram format, wherein certain features are disclosed in separate blocks. These should be understood broadly to disclose how various features interoperate, but are not intended to imply that those features must necessarily be embodied in separate hardware or software. Furthermore, where a single block discloses more than one feature in the same block, those features need not necessarily be embodied in the same hardware and/or software. For example, a computer "memory" could in some circumstances be distributed or mapped between multiple levels of cache or local memory, main memory, battery-backed volatile memory, and various forms of persistent memory such as a hard disk, storage server, optical disk, tape drive, or similar. In certain embodiments, some of the components may be omitted or consolidated. In a general sense, the arrangements depicted in the FIGURES may be more logical in their representations, whereas a physical architecture may include various permutations, combinations, and/or hybrids of these elements. Countless possible design configurations can be used to achieve the operational objectives outlined herein. Accordingly, the associated infrastructure has a myriad of substitute arrangements, design choices, device possibilities, hardware configurations, software implementations, and equipment options.

References may be made herein to a computer-readable medium, which may be a tangible and non-transitory computer-readable medium. As used in this specification and throughout the claims, a "computer-readable medium" should be understood to include one or more computer-readable mediums of the same or different types. A computer-readable medium may include, by way of nonlimiting example, an optical drive (e.g., CD/DVD/Blu-Ray), a hard drive, a solid-state drive, a flash memory, or other nonvolatile medium. A computer-readable medium could also include a medium such as a ROM, a field-programmable gate array (FPGA), or ASIC configured to carry out the desired instructions, stored instructions for programming an FPGA or ASIC to carry out the desired instructions, an IP block that can be integrated in hardware into other circuits, or instructions encoded directly into hardware or microcode on a processor such as a microprocessor, DSP, microcontroller, or in any other suitable component, device, element, or object where appropriate and based on particular needs. A non-transitory storage medium herein is expressly intended to include any non-transitory special-purpose or programmable hardware configured to provide the disclosed operations, or to cause a processor to perform the disclosed operations.

Various elements may be "communicatively," "electrically," "mechanically," or otherwise "coupled" to one another throughout this specification and the claims. Such coupling may be a direct, point-to-point coupling, or may include intermediary devices. For example, two devices may be communicatively coupled to one another via a controller that facilitates the communication. Devices may be electrically coupled to one another via intermediary devices such as signal boosters, voltage dividers, or buffers. Mechanically coupled devices may be indirectly mechanically coupled.

Any "module" or "engine" disclosed herein may refer to or include software, a software stack, a combination of hardware, firmware, and/or software, a circuit configured to carry out the function of the engine or module, or any computer-readable medium as disclosed above. Such modules or engines may, in appropriate circumstances, be provided on or in conjunction with a hardware platform, which may include hardware compute resources such as a processor, memory, storage, interconnects, networks and network interfaces, accelerators, or other suitable hardware. Such a hardware platform may be provided as a single monolithic device (e.g., in a PC form factor), or with some or part of the function being distributed (e.g., a "composite node" in a high-end data center, where compute, memory, storage, and other resources may be dynamically allocated and need not be local to one another).

There may be disclosed herein flow charts, signal flow diagram, or other illustrations showing operations being performed in a particular order. Unless otherwise expressly noted, or unless required in a particular context, the order should be understood to be a nonlimiting example only. Furthermore, in cases where one operation is shown to follow another, other intervening operations may also occur, which may be related or unrelated. Some operations may also be performed simultaneously or in parallel. In cases where an operation is said to be "based on" or "according to" another item or operation, this should be understood to imply that the operation is based at least partly on or according at least partly to the other item or operation. This should not be construed to imply that the operation is based solely or exclusively on, or solely or exclusively according to the item or operation.

All or part of any hardware element disclosed herein may readily be provided in an SoC, including a CPU package. An SoC represents an integrated circuit (IC) that integrates components of a computer or other electronic system into a single chip. Thus, for example, client devices or server devices may be provided, in whole or in part, in an SoC. The SoC may contain digital, analog, mixed-signal, and radio frequency functions, all of which may be provided on a single chip substrate. Other embodiments may include a multichip module (MCM), with a plurality of chips located within a single electronic package and configured to interact closely with each other through the electronic package.

In a general sense, any suitably-configured circuit or processor can execute any type of instructions associated with the data to achieve the operations detailed herein. Any processor disclosed herein could transform an element or an article (for example, data) from one state or thing to another state or thing. Furthermore, the information being tracked, sent, received, or stored in a processor could be provided in any database, register, table, cache, queue, control list, or storage structure, based on particular needs and implementations, all of which could be referenced in any suitable timeframe. Any of the memory or storage elements disclosed herein, should be construed as being encompassed within the broad terms "memory" and "storage," as appropriate.

Computer program logic implementing all or part of the functionality described herein is embodied in various forms, including, but in no way limited to, a source code form, a computer executable form, machine instructions or microcode, programmable hardware, and various intermediate forms (for example, forms generated by an assembler, compiler, linker, or locator). In an example, source code includes a series of computer program instructions implemented in various programming languages, such as an object code, an assembly language, or a high level language such as OpenCL, FORTRAN, C, C++, JAVA, or HTML for use with various operating systems or operating environments, or in hardware description languages such as Spice, Verilog, and VHDL. The source code may define and use various data structures and communication messages. The source code may be in a computer executable form (e.g., via an interpreter), or the source code may be converted (e.g., via a translator, assembler, or compiler) into a computer executable form, or converted to an intermediate form such as byte code. Where appropriate, any of the foregoing may be used to build or describe appropriate discrete or integrated circuits, whether sequential, combinatorial, state machines, or otherwise.

In one example embodiment, any number of electrical circuits of the FIGURES may be implemented on a board of an associated electronic device. The board can be a general circuit board that can hold various components of the internal electronic system of the electronic device and, further, provide connectors for other peripherals. Any suitable processor and memory can be suitably coupled to the board based on particular configuration needs, processing demands, and computing designs. Note that with the numerous examples provided herein, interaction may be described in terms of two, three, four, or more electrical components. However, this has been done for purposes of clarity and example only. It should be appreciated that the system can be consolidated or reconfigured in any suitable manner. Along similar design alternatives, any of the illustrated components, modules, and elements of the FIGURES may be combined in various possible configurations, all of which are within the broad scope of this specification.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 (pre-AIA) or paragraph (f) of the same section (post-AIA), as it exists on the date of the filing hereof unless the words "means for" or "steps for" are specifically used in the particular claims; and (b) does not intend, by any statement in the specification, to limit this disclosure in any way that is not otherwise expressly reflected in the appended claims.

EXAMPLE IMPLEMENTATIONS

There is disclosed in one example a heat dissipator for an electronic apparatus, comprising: a planar vapor chamber having a substantially rectangular form factor, wherein a second dimension $d_2$ of the rectangular form factor is at least approximately twice a first dimension $d_1$ of the rectangular form factor; a first fan and second fan; and a first heat pipe and second heat pipe discrete from the planar vapor chamber and disposed along first and second $d_1$ edges of the planar vapor chamber, further disposed to conduct heat from the first and second $d_1$ edges to the first and second fan respectively.

There is further disclosed an example heat dissipator, wherein $d_2$ is between approximately $2 \cdot d_1$ and $5 \cdot d_1$.

There is further disclosed an example heat dissipator, wherein the heat pipe is disposed along a $d_1$ edge of the vapor chamber.

There is further disclosed an example heat dissipator, further comprising a second heat pipe disposed along an opposite $d_1$ edge of the vapor chamber.

There is further disclosed an example heat dissipator, wherein the first and second heat pipes are vapor chambers.

There is further disclosed an example heat dissipator, wherein the vapor chamber further comprises wicking means to conduct fluid from a condenser of the vapor chamber to an evaporator of the vapor chamber.

There is further disclosed an example heat dissipator, wherein the wicking means are locally absent from a portion of the planar vapor chamber.

There is further disclosed an example heat dissipator, wherein the wicking means are locally absent from approximately 30% or 45% of the planar vapor chamber.

There is further disclosed an example heat dissipator, wherein the wicking means are locally absent from approximately 15% to 70% of the planar vapor chamber.

There is further disclosed an example heat dissipator, wherein the portion of the vapor chamber provides a vapor flow path from an evaporator of the vapor chamber to a condenser of the vapor chamber.

There is further disclosed an example heat dissipator, wherein the planar vapor chamber further comprises radial pattern internal support ribbing.

There is also disclosed an example computing system, comprising: a processor; a memory; a human interface; and the heat dissipator of a number of the above examples.

There is further disclosed an example computing system, wherein the system is a laptop computer.

There is further disclosed an example computing system, wherein the system is a tablet computer or smart phone.

There is also disclosed an example vapor chamber, comprising: an upper wall; a heat conductive lower wall wherein the upper wall and lower wall are hermetically sealed together, and wherein the vapor chamber is evacuated of air; an evaporative fluid disposed within the vapor chamber; and a metallic wick affixed to the upper wall and lower wall and disposed to conduct fluid from a condenser region of the vapor chamber to an evaporator region of the vapor chamber, wherein the metallic wick is locally absent from a portion of the upper wall.

There is further disclosed an example vapor chamber, wherein the portion of the upper wall is approximately 30% or 45%.

There is further disclosed an example vapor chamber, wherein the portion of the upper wall is between 15% and 70%.

There is further disclosed an example vapor chamber, wherein the portion of the upper wall is selected to provide a flow from the evaporator portion to the condenser portion.

There is further disclosed an example vapor chamber, wherein the metallic wick is locally absent from a portion of the lower wall.

There is further disclosed an example vapor chamber, wherein the metallic wick forms a starburst pattern on at least one of the upper wall or lower wall.

There is further disclosed an example vapor chamber, wherein the vapor chamber is planar.

There is further disclosed an example heat dissipation assembly comprising the vapor chamber of a number of the above examples.

There is further disclosed an example heat dissipation assembly, further comprising a heat pipe.

There is further disclosed an example heat dissipation assembly, wherein the vapor chamber has a first dimension $d_1$ and a second dimension $d_2$, wherein $d_2$ is between approximately $2 \cdot d_1$ and $5 \cdot d_1$, and wherein the heat pipe is disposed along the axis of $d_1$.

There is further disclosed an example computing system comprising a processor, a memory, and the heat dissipation assembly of a number of the above examples.

There is also disclosed an example vapor chamber, comprising: an upper wall; a lower wall hermetically sealed to the upper wall to form a vacuum chamber; an evaporative fluid within the vacuum chamber; wicking means to carry condenser vapor from a condenser region of the vapor chamber to an evaporator region of the vapor chamber; and starburst-patterned ribbing on at least one of the upper wall and lower wall.

There is further disclosed an example vapor chamber, wherein the starburst-patterned ribbing provides at least some of the wicking means.

There is further disclosed an example vapor chamber, further comprising mount points for the vapor chamber that pass through one or more terminals of the starburst pattern.

There is further disclosed an example vapor chamber, wherein the wicking means comprise a porous metal.

There is further disclosed an example vapor chamber, wherein the wicking means comprise capillaries.

There is further disclosed an example vapor chamber, wherein capillaries run along radial arms of the starburst pattern.

There is further disclosed an example vapor chamber, wherein the wicking means is locally absent from selected portions of the vapor chamber.

There is further disclosed an example vapor chamber, wherein the selected portions comprise approximately 30% or 45% of the vapor chamber.

There is further disclosed an example vapor chamber, wherein the selected portion is between approximately 15% and 70% of the vapor chamber.

There is further disclosed an example vapor chamber, further comprising a heat pipe to conduct heat from an edge of the vapor chamber.

There is further disclosed an example vapor chamber, wherein the vapor chamber is substantially rectangular.

There is further disclosed an example vapor chamber, wherein the rectangular vapor chamber has a planar dimension at least approximately twice another planar dimension.

There is further disclosed an example vapor chamber, wherein the rectangular vapor chamber has a planar dimension between approximately two times and five times the size of another planar dimension.

There is further disclosed an example heat dissipator for a computer apparatus, comprising: a fan; a heat sink; and the vapor chamber of a number of the above examples.

There is further disclosed an example computing apparatus comprising the heat dissipator of a number of the above examples.

There is further disclosed an example computing apparatus, wherein the apparatus is a laptop computer.

There is further disclosed an example computing apparatus, wherein the apparatus is a tablet or smart phone.

What is claimed is:

1. A heat dissipator for an electronic apparatus, comprising:
   a planar vapor chamber having a substantially rectangular form factor, wherein a second dimension ($d_2$) of the rectangular form factor is at least twice a first dimension ($d_1$) of the rectangular form factor;
   a first fan located adjacent to a $d_2$ edge of the planar vapor chamber and proximate to a first $d_1$ edge of the planar vapor chamber;
   a second fan located adjacent to the $d_2$ edge of the planar vapor chamber and proximate to a second $d_1$ edge of the planar vapor chamber, wherein the second $d_1$ edge of the planar vapor chamber is opposite the first $d_1$ edge of the planar vapor chamber;
   a first heat pipe discrete from the planar vapor chamber and located along the first $d_1$ edge of the planar vapor chamber, wherein the first heat pipe is disposed to conduct heat from the first $d_1$ edge of the planar vapor chamber to the first fan; and
   a second heat pipe discrete from the planar vapor chamber and located along the second $d_1$ edge of the planar vapor chamber, wherein the second heat pipe is disposed to-conduct heat from the second $d_1$ edge of the planar vapor chamber to the second fan.

2. The heat dissipator of claim 1, wherein the $d_2$ of the planar vapor chamber is between two times the $d_1$ ($2 \cdot d_1$) and five times the $d_1$ ($5 \cdot d_1$).

3. The heat dissipator of claim 1, wherein the first heat pipe extends beyond the $d_2$ edge of the planar vapor chamber.

4. The heat dissipator of claim 3, wherein the second heat pipe extends beyond the $d_2$ edge of the planar vapor chamber.

5. The heat dissipator of claim 1, wherein the second heat extends beyond the $d_2$ edge of the planar vapor chamber.

6. The heat dissipator of claim 1, wherein the first heat pipe is a second vapor chamber and the second heat pipe is a third vapor chamber.

7. The heat dissipator of claim 1, wherein the planar vapor chamber further comprises wicking means to conduct fluid from a condenser of the planar vapor chamber to an evaporator of the planar vapor chamber.

8. The heat dissipator of claim 7, wherein the wicking means are locally absent from a portion of the planar vapor chamber.

9. The heat dissipator of claim 1, wherein the planar vapor chamber further comprises radial pattern internal support ribbing.

10. A computing system, comprising:
    a processor;
    a memory;
    a human interface; and
    the heat dissipator of claim 1.

11. The computing system of claim 10, wherein the system is a laptop computer.

* * * * *